(12) United States Patent
Grale

(10) Patent No.: US 6,434,213 B1
(45) Date of Patent: Aug. 13, 2002

(54) LOW-POWER LOW-AREA SHIFT REGISTER

(75) Inventor: Trenton John Grale, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/803,222

(22) Filed: Mar. 8, 2001

(51) Int. Cl.[7] .............................................. G11C 19/00
(52) U.S. Cl. ...................................................... 377/78
(58) Field of Search ........................................... 377/78

(56) References Cited

U.S. PATENT DOCUMENTS 4,876,704 A * 10/1989 Ozaki ........................... 377/70
5,150,389 A * 9/1992 Kawasaki .................... 377/67
5,589,787 A * 12/1996 Odinot ........................ 327/202
6,061,417 A * 5/2000 Kelem .......................... 377/26

* cited by examiner

*Primary Examiner*—Margaret R. Wambach
(74) *Attorney, Agent, or Firm*—James J. Murphy; Winstead Sechrest & Minick

(57) ABSTRACT

A low power, low area shift register permits control over delay by dividing the shift register cells into a plurality of segments that are serially connected. A first selector provides data from a shift register input selectively to an input of one of the segments. A second selector provides data from an input or output of a selected cell of one segment of shift register cells to a shift register output.

12 Claims, 43 Drawing Sheets

- Fifth order decimate by 8:

$$H(z) = \left(\frac{1-z^{-8}}{1-z^{-1}}\right)^5$$

- 36 tap FIR filter. Half of the (symmetric) coefficients

| $h_0=1$ | $h_1=5$ | $h_2=15$ | $h_3=35$ | $h_4=70$ | $h_5=126$ | $h_6=210$ | $h_7=330$ | $h_8=490$ |
|---|---|---|---|---|---|---|---|---|
| $h_9=690$ | $h_{10}=926$ | $h_{11}=1190$ | $h_{12}=1470$ | $h_{13}=1750$ | $h_{14}=2010$ | $h_{15}=2226$ | $h_{16}=2380$ | $h_{17}=2460$ |

FIGURE 7

$$H(z) = \left(\frac{1-z^{-2}}{1-z^{-1}}\right)^6$$

Impulse Response:

$y[n] = x[n] + 6 \cdot x[n-1] + 15 \cdot x[n-2] + 20 \cdot x[n-3] + 15 \cdot x[n-4] + 6 \cdot x[n-5] + x[n-6]$

FIGURE 9

3. Bismarck Sinc1b Functional Diagram

| Filter Name | System Function | Impulse Response (Filter Coefficients) |
|---|---|---|
| Sinc2(a) Sinc2(b) | $H(z) = \left(\dfrac{1-z^{-2}}{1-z^{-1}}\right)^4$ | $h[n] = [1\ 4\ 6\ 4\ 1]$ |
| Sinc2(c) | $H(z) = \left(\dfrac{1-z^{-3}}{1-z^{-1}}\right)^4$ | $h[n] = [1\ 4\ 10\ 16\ 19\ 16\ 10\ 4\ 1]$ |
| Sinc2(d) | $H(z) = \left(\dfrac{1-z^{-2}}{1-z^{-1}}\right)^5$ | $h[n] = [1\ 5\ 10\ 10\ 5\ 1]$ |
| Sinc2(e) | $H(z) = \left(\dfrac{1-z^{-2}}{1-z^{-1}}\right)^6$ | $h[n] = [1\ 6\ 15\ 20\ 15\ 6\ 1]$ |

FIGURE 11

FIGURE 13A  Sinc2(c):

$y[n] = x[n] + 4x[n-1] + 10x[n-2] + 16x[n-3] + 19x[n-4] + 16x[n-5] + 10x[n-6] + 4x[n-7] + x[n-8]$ $= x[n] + 4x[n-1] + \boxed{8x[n-2] + 2x[n-2]} + \boxed{16x[n-3] + 16x[n-4] + 2x[n-4] + x[n-4]}$
$+ 16x[n-5] + \boxed{8x[n-6] + 2x[n-6]} + 4x[n-7] + x[n-8]$

FIGURE 13B  Sinc2(d):

$y[n] = x[n] + 5x[n-1] + 10x[n-2] + 10x[n-3] + 5x[n-4] + x[n-5]$ $= x[n] + \boxed{4x[n-1] + x[n-1]} + \boxed{8x[n-2] + 2x[n-2]} + \boxed{8x[n-3] + 2x[n-3]} + \boxed{4x[n-4] + x[n-4]} + x[n-5]$

FIGURE 13C  Sinc2(e):

$y[n] = x[n] + 6x[n-1] + 15x[n-2] + 20x[n-3] + 15x[n-4] + 6x[n-5] + x[n-6]$ $= x[n] + \boxed{4x[n-1] + 2x[n-1]} + \boxed{16x[n-2] - x[n-2]} + \boxed{16x[n-3] + 4x[n-3]} + \boxed{16x[n-4] - x[n-4]} + \boxed{4x[n-5] + 2x[n-5]} + x[n-6]$

Sinc2(a) and Sinc2(b):
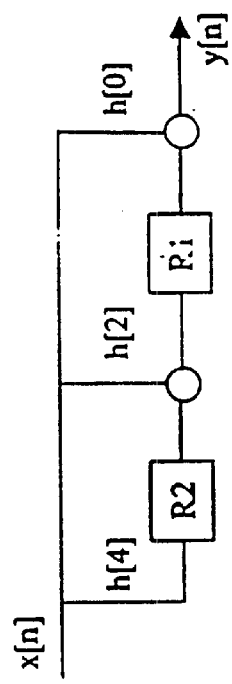
Accumulate Phase (2 additions)
FIGURE 14A
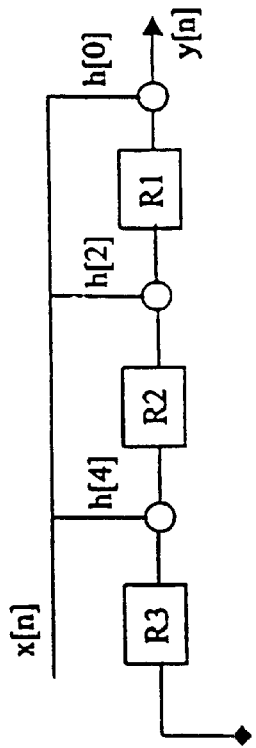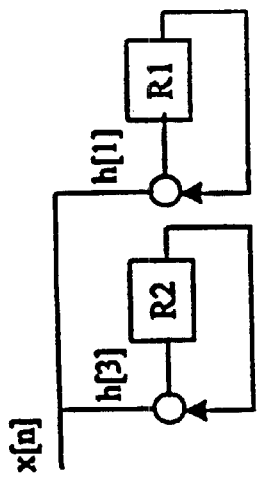
Output Phase (4 additions)
FIGURE 14B
Sinc2(d):
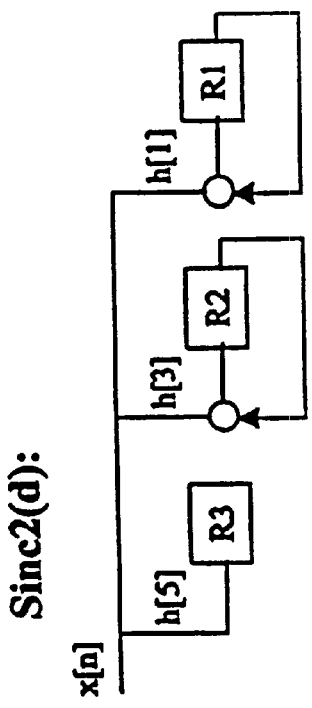
Accumulate Phase (5 additions)
FIGURE 15A
Output Phase (5 additions)
FIGURE 15B

Sinc2(c):

Accumulate Phase A (4 additions)

Accumulate Phase B (5 additions)

Output Phase (4 additions)

Sinc2(e):

Accumulate Phase (6 additions)

Output Phase (6 additions)

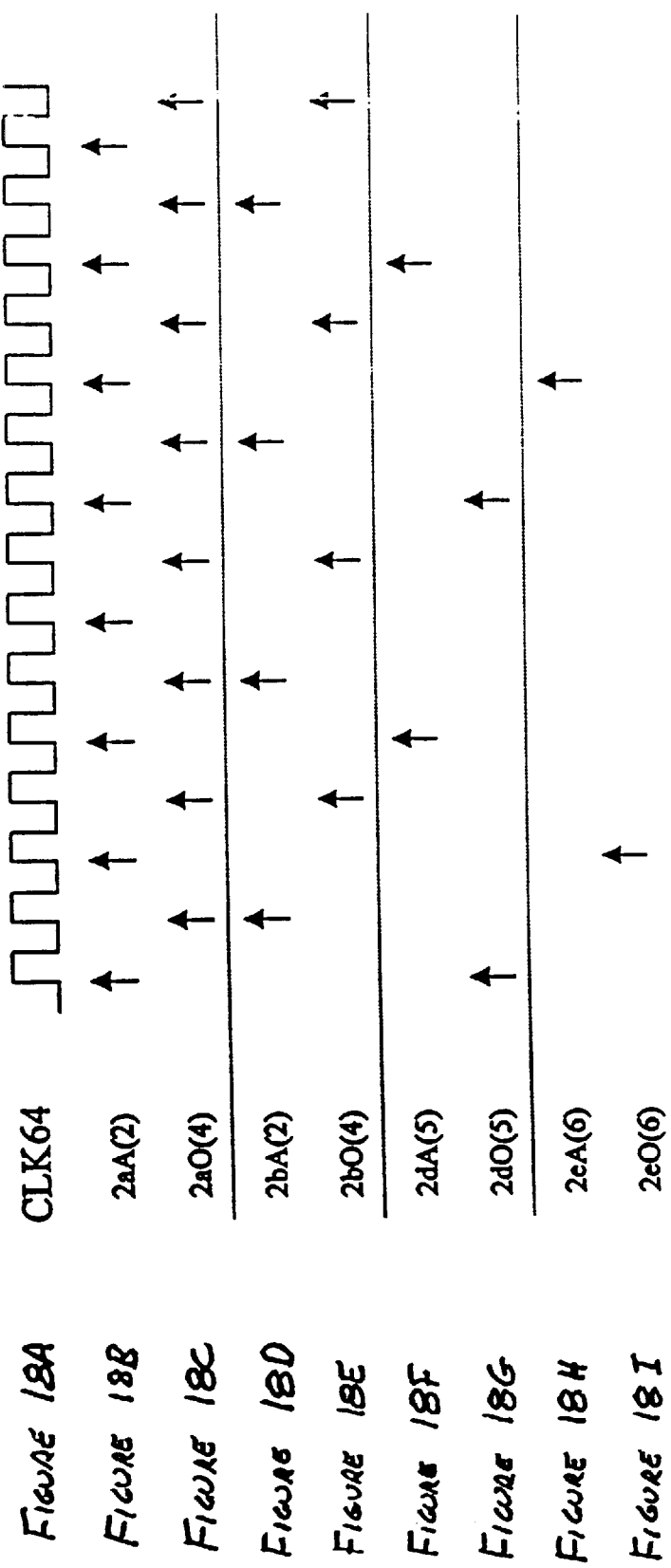

Programming Procedure:

1. Select decimation rate.
2. Select required mini-sincs and associated Accumulate and Output subroutines.
3. Separate coefficients into form suitable for shift-add operations.
4. Check for overflow after each addition in the filter.
5. Perform necessary truncation to 24 bits and scaling of subsequent coefficients in mini-sincs.
6. Time multiplex Accumulate and Output Subroutines so that a maximum of 8 additions/subtractions are performed for each input from sinc1.
7. Create code for RAM2 (Accumulate and Output Subroutines) in the form:
   [Coeff 1] [Src 1] [Src 2] [Dest] [Coeff2] [Done Subroutine]
8. Create code for RAM1 (Main Control code)
   [Line #] [Wait for new data] [Done program]

FIGURE 21

FIGURE 30c1 ——————— wire
FIGURE 30c2 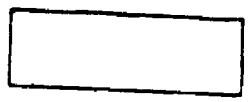 24 wires
FIGURE 30c3  register
FIGURE 30c4  multiplexer
FIGURE 30c5  tristate buffer
FIGURE 30c6  inverter
FIGURE 30c7 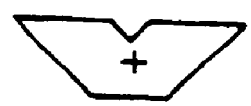 exclusive or gate
FIGURE 30c8  adder
FIGURE 30c9  multiplier
FIGURE 30c10  right shifter

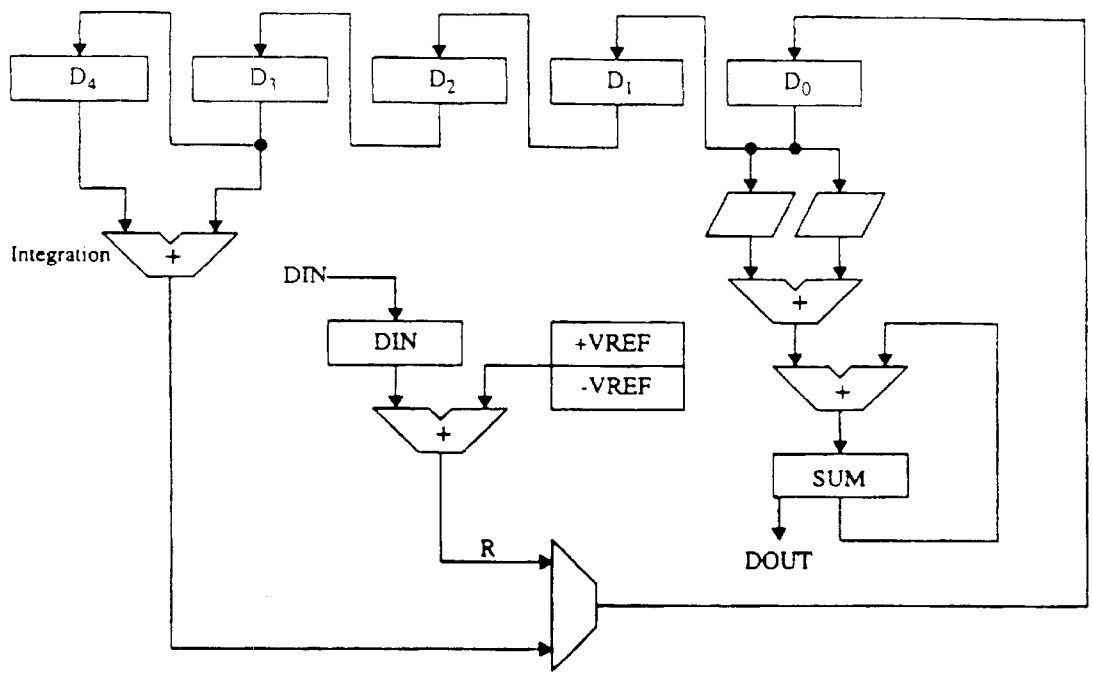
FIGURE 30F1
| State | Actions During State | | |
|---|---|---|---|
| S0 | $D_0(D4_k) = D_4(D4_{k-1}) + D_3(D3_{k-1})$ | Clear SUM | Load $DIN_k$ |
| S1 | $D_0(D3_k) = D_4(D3_{k-1}) + D_3(D2_{k-1})$ | $SUM_k \mathrel{+}= D_0(D4_k) \text{>>} Shift4$ | |
| S2 | $D_0(D2_k) = D_4(D2_{k-1}) + D_3(D1_{k-1})$ | $SUM_k \mathrel{+}= D_0(D3_k) \text{>>} Shift3$ | |
| S3 | $D_0(D1_k) = D_4(D1_{k-1}) + D_3(R_{k-1})$ | $SUM_k \mathrel{+}= D_0(D2_k) \text{>>} Shift2$ | |
| S4 | | $SUM_k \mathrel{+}= D_0(D1_k) \text{>>} Shift1$ | |
| S5 | $D_0(R_k) = DIN_k \text{+/-} VREF$ | | |
FIGURE 30F2

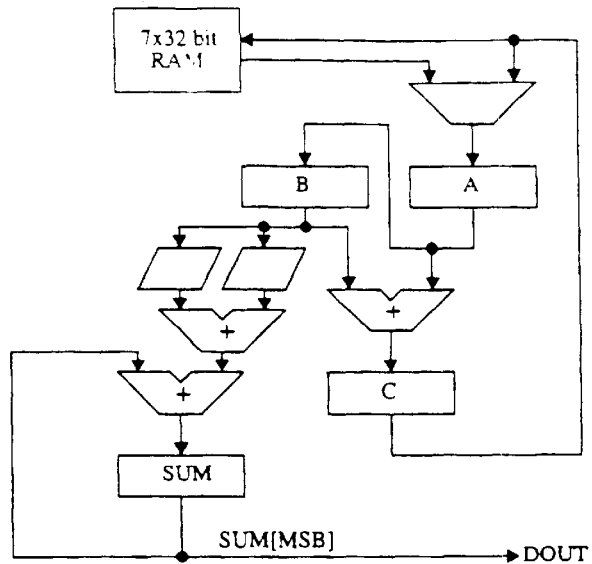

FIGURE 30G1

| State | Actions During State | | | |
|---|---|---|---|---|
| S0 | Clear SUM | Clear C | Clear B | Clear A |
| S1 | | | | Load A<Mem($D4_k$) |
| S2 | | | Shift B<A($D4_k$) | Load A<Mem($D3_k$) |
| S3 | $SUM_k$ += B($D4_k$)>>Shift4 | C = B($D4_k$) + A($D3_k$) | Shift B<A($D3_k$) | Load A<Mem($D2_k$) |
| S4 | | | | Store C>Mem($D4_{k+1}$) |
| S5 | $SUM_k$ += B($D3_k$)>>Shift3 | C = B($D3_k$) + A($D2_k$) | Shift B<A($D2_k$) | Load A<Mem($D1_k$) |
| S6 | | | | Store C>Mem($D3_{k+1}$) |
| S7 | $SUM_k$ += B($D2_k$)>>Shift2 | C = B($D2_k$) + A($D1_k$) | Shift B<A($D1_k$) | Load A<Mem($DIN_k$) |
| S8 | | | | Store C>Mem($D2_{k+1}$) |
| S9 | $SUM_k$ += B($D1_k$)>>Shift1 | C = B($D1_k$) + A($DIN_k$) | Shift B<A($DIN_k$) | Load A<Mem(VREF) |
| S10 | | | Shift B<A(VREF) | LoadReg A<C(Temp) |
| S11 | | C = +/-B(VREF) + A(Temp) | | |
| S12 | | | | Store C>Mem($D1_{k+1}$) |

FIGURE 30G2

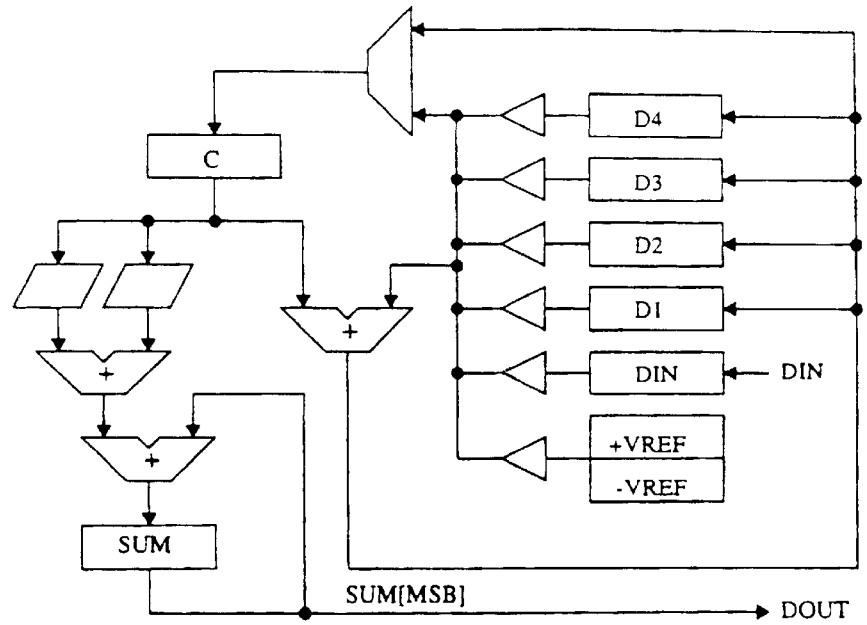
FIGURE 30 H1
| State | Actions During State | | | |
|---|---|---|---|---|
| S0 | Clear SUM | Load C < $D4_k$ | | Load $DIN_k$ |
| S1 | $SUM_k$ += $C(D4_k)$>>Shift4 | Load C < $D3_k$ | $D4_{k+1}$ = $C(D4_k)$ + $D3_k$ | |
| S2 | $SUM_k$ += $C(D3_k)$>>Shift3 | Load C < $D2_k$ | $D3_{k+1}$ = $C(D3_k)$ + $D2_k$ | |
| S3 | $SUM_k$ += $C(D2_k)$>>Shift2 | Load C < $D1_k$ | $D2_{k+1}$ = $C(D2_k)$ + $D1_k$ | |
| S4 | $SUM_k$ += $C(D1_k)$>>Shift1 | C(Temp) = $C(D1_k)$ + $DIN_k$ | | |
| S5 | | | $D1_{k+1}$ = C(Temp) +/- VREF | |
FIGURE 30H2

| P | Feedforward | Integration | Temp | Din | SUM | SUMSIGN | TEMP | S Bus | I Bus | Write I |
|---|---|---|---|---|---|---|---|---|---|---|
| 0 | $SUM_k = D4_k >> 11$ $+ D4_k >> 9$ $+ D4_k >> 7$ | $D4_{k+1} = D4_k + D3_k$ | | Load $DIN_k$ | Write | | | $+D4>>7$ $+D4>>9$ $+D4>>11$ | $+D3$ | D4 |
| 1 | $SUM_k = SUM_k$ $+ D3_k >> 8$ $+ D3_k >> 5$ $+ D3_k >> 4$ | $D3_{k+1} = D3_k + D2_k$ | | | Acc/ Write | | | $+D3>>4$ $+D3>>5$ $+D3>>8$ | $+D2$ | D3 |
| 2 | $SUM_k = SUM_k$ $+ D2_k >> 1$ $- D2_k >> 7$ $- D2_k >> 4$ | $D2_{k+1} = D2_k + D1_k$ | | | Acc/ Write | | | $-D2>>4$ $+D2>>1$ $-D2>>7$ | $+D1$ | D2 |
| 3 | $SUM_k = SUM_k$ $+ D1_k$ | $D1_{k+1}' = D1_k' + DIN_k$ | | | | Write | | $+D1$ $+D1$ $-D1$ | $+DIN$ | D1 |
| 4 | | $D1_{k+1} = D1_{k+1}' +/- VREF$ | | | | | | | $+FB$ | D1 |
| 5 | | | | | | | | | | |
| 6 | | | | | | | | | | |
| 7 | | | | | | | | | | |

FIGURE 33

| | | | HEX | 051C 00E4AC | 04D3 0082A1 | 048A 00909F | 1469 000003 | 0079 000000 | 0000 000000 | 0000 000000 | 0000 000000 |
|---|---|---|---|---|---|---|---|---|---|---|---|
| A | | 0 | | 0 | 1 | 1 | 1 | 0 | 0 | 0 | 0 |
| shift_s3 | s s 3 | 1 | | 0 | 0 | 1 | 1 | 0 | 0 | 0 | 0 |
| | | 2 | | 1 | 0 | 1 | 0 | 0 | 0 | 0 | 0 |
| | | 3 | | 1 | 0 | 1 | 0 | 0 | 0 | 0 | 0 |
| | | 4 | | 0 | 0 | 1 | 0 | 0 | 0 | 0 | 0 |
| | | 5 | | 1 | 1 | 0 | 0 | 0 | 0 | 0 | 0 |
| | | 6 | | 0 | 0 | 0 | 0 | 0 | 0 | 0 | 0 |
| shift_s2 | | 7 | | 1 | 1 | 1 | 0 | 0 | 0 | 0 | 0 |
| | | 8 | | 0 | 0 | 0 | 0 | 0 | 0 | 0 | 0 |
| | | 9 | | 0 | 1 | 0 | 0 | 0 | 0 | 0 | 0 |
| | | 10 | | 1 | 0 | 0 | 0 | 0 | 0 | 0 | 0 |
| | | 11 | | 0 | 0 | 0 | 0 | 0 | 0 | 0 | 0 |
| shift_s1 | s s 1 | 12 | | 0 | 0 | 1 | 0 | 0 | 0 | 0 | 0 |
| | | 13 | | 1 | 0 | 0 | 0 | 0 | 0 | 0 | 0 |
| | | 14 | | 1 | 0 | 0 | 0 | 0 | 0 | 0 | 0 |
| | | 15 | | 1 | 1 | 1 | 0 | 0 | 0 | 0 | 0 |
| | | 16 | | 0 | 0 | 0 | 0 | 0 | 0 | 0 | 0 |
| | | 17 | | 0 | 0 | 0 | 0 | 0 | 0 | 0 | 0 |
| shiftJ | s J | 18 | | 0 | 0 | 0 | 0 | 0 | 0 | 0 | 0 |
| | | 19 | | 0 | 0 | 0 | 0 | 0 | 0 | 0 | 0 |
| | | 20 | | 0 | 0 | 0 | 0 | 0 | 0 | 0 | 0 |
| | | 21 | | 0 | 0 | 0 | 0 | 0 | 0 | 0 | 0 |
| | | 22 | | 0 | 0 | 0 | 0 | 0 | 0 | 0 | 0 |
| | | 23 | | 0 | 0 | 0 | 0 | 0 | 0 | 0 | 0 |
| sbus_en | | 24 | | 0 | 1 | 0 | 1 | 1 | 0 | 0 | 0 |
| | | 25 | | 0 | 1 | 1 | 0 | 0 | 0 | 0 | 0 |
| | | 26 | | 1 | 0 | 0 | 0 | 0 | 0 | 0 | 0 |
| lbus_en | | 27 | | 1 | 0 | 1 | 1 | 1 | 0 | 0 | 0 |
| | | 28 | | 1 | 1 | 0 | 0 | 1 | 0 | 0 | 0 |
| | | 29 | | 0 | 0 | 0 | 1 | 1 | 0 | 0 | 0 |
| wr_d | | 30 | | 0 | 1 | 0 | 1 | 1 | 0 | 0 | 0 |
| | | 31 | | 0 | 1 | 1 | 0 | 0 | 0 | 0 | 0 |
| | | 32 | | 1 | 0 | 0 | 0 | 0 | 0 | 0 | 0 |
| T | | 33 | | 0 | 0 | 0 | 0 | 0 | 0 | 0 | 0 |
| S | | 34 | | 1 | 1 | 1 | 1 | 0 | 0 | 0 | 0 |
| C | | 35 | | 0 | 0 | 0 | 0 | 0 | 0 | 0 | 0 |
| G | | 36 | | 0 | 0 | 0 | 1 | 0 | 0 | 0 | 0 |

FIGURE 34

Table 1: Legend

| | |
|---|---|
| dout_dly0 | data output bit, 0 delay |
| dout | data output bit, 0-63 clock delay |
| delay[5:0] | how many clocks (0-63) to delay output data dout_dly0 |
| delay[5:4] | selects segment into which to direct dout_dly0 |
| delay[3:0] | selects where to tap segment D to get dout |

FIGURE 36
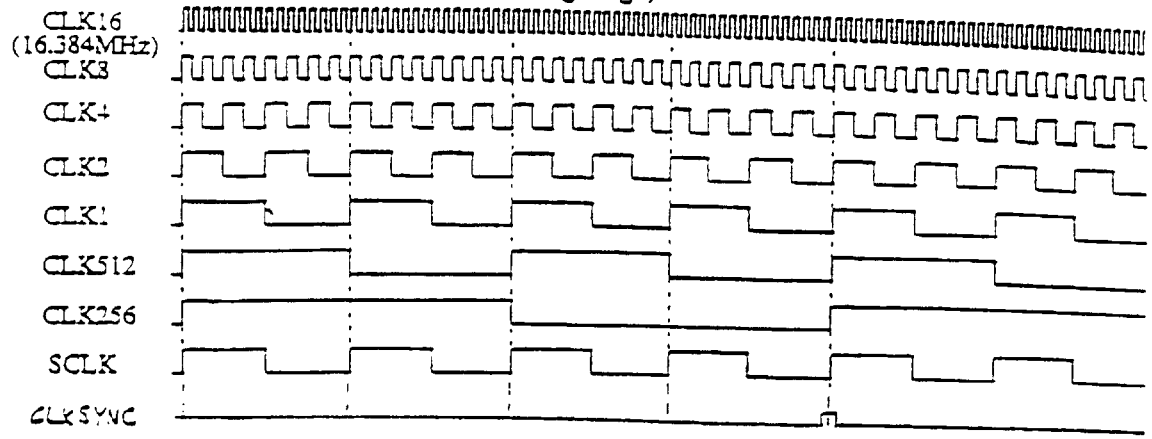
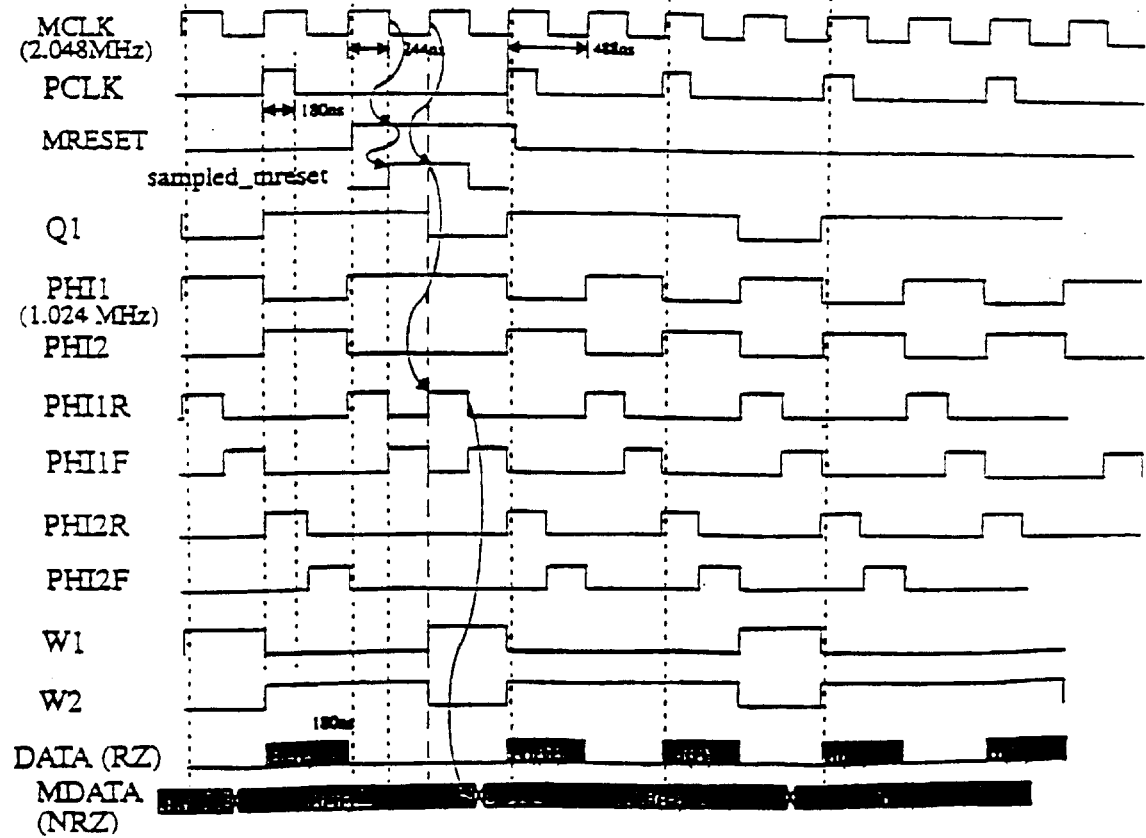

LOW-POWER LOW-AREA SHIFT REGISTER

CROSS REFERENCE TO RELATED APPLICATIONS

This application is related to U.S. patent application Ser. No. 09/802744, filed concurrently herewith, by inventors Joel W. Page, Wai Laing Lee and Erng Sing Wee, entitled "AN INTEGRATED CIRCUIT ARRANGEMENT FOR MULTIPLE-SENSOR TYPES WITH SELECTABLE FRONT ENDS".

This application is related to U.S. patent application Ser. No. 09/803350, filed concurrently herewith, by inventors Trenton J. Grale and Sijian Chen, entitled "A PROGRAMMABLE TEST MODULATOR FOR SELECTIVELY GENERATING TEST SIGNALS OF DELTA-SIGMA ORDER N".

This application is related to U.S. patent application Ser. No. 09/803349, filed concurrently herewith, by inventors Joel W. Page, Trenton J. Grale, Zhuan Ye, Erng Sing Wee, Sumant Sathe and Sijian Chen entitled "A SIGNAL PROCESSING INTEGRATED CIRCUIT".

BACKGROUND OF THE INVENTION

1. Field of the Invention

The invention is directed to shift registers, and more particularly, to a low power shift register having selectable segments for adjusting delay.

2. Description of Related Art

Systems for conducting seismic exploration are well known in the art. On land, a plurality of transducers are deployed over a region and configured to receive reflections of an acoustic signal from different geophysical layers beneath the surface of the earth. In the ocean, arrays of transducers may be towed behind a boat in a spaced configuration in order to detect those reflections. In transition regions, between land and ocean, sensors may be positioned underwater at fixed locations. Different types of sensors may be utilized for the different environments in which they may be deployed.

When utilizing a seismic system, a strong acoustic signal is generated by, for example, setting off an explosion or by utilizing an acoustic signal generator having a relatively high power output. Reflections of the acoustic signals from the geophysical layers are then received at the seismic sensors deployed over a given area and the signals recorded, typically, for later analysis.

In some configurations, a seismic sensor is co-located with an analog to digital converter, such as a delta-sigma modulator, which converts an analog signal from the sensor into a digital signal for recording and processing. Seismic exploration has exacting requirements for seismic sensors and for the electronics which process the signals derived from those sensors. There is therefore a need to be able to test both the sensors and related equipment to ensure that both devices and the associated electronics are functioning properly.

SUMMARY OF THE INVENTION

The invention relates to a low power, low area shift register that permits control over delay by selectively directing an input signal to one of a plurality of segments of serially connected shift. register cells, the segments being serially connected. The output of the shift register is taken selectively from a selected cell of one segment of shift register cells. The invention is also directed to techniques for designing and fabricating a shift register.

Still other objects and advantages of the present invention will become readily apparent to those skilled in the art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 7 shows coefficients and the mathematical representation of the Sinc1A filter implementation.

FIG. 9 is depicts the coefficients and the mathematical representation of the Sinc1B filter.

FIG. 11 is a table showing the mathematical representation and the filter coefficients for the Sinc2($a$), Sinc2($b$), Sinc2($c$), Sinc2($d$) and Sinc2($e$) filters.

FIGS. 13A, 13B and 13C show the shift add implementation of Sinc filters Sinc2($c$), Sinc2($d$) and Sinc2($e$), respectively.

FIGS. 14A and 14B show implementation of the Sinc2($a$) and Sinc2($b$) filters with their respective common accumulate phase and output phase.

FIGS. 15A and 15B show implementation of the Sinc2($d$) filter with its respective accumulate phase and output phase.

FIGS. 18A though 18I show implementation of the Sinc2 filter with the accumulate-output architecture with respective time multiplexing phases.

FIG. 21 is a flow chart of a programming procedure for the Sinc filters.

FIG. 30 is a block diagram showing the TMOD buffers and filters shown in FIG. 1 in more detail.

FIGS. 30C1 through 30C10 identify symbols used in FIGS. 30D through 30H.

FIG. 30F1 shows one implementation of the digital Σ modulator of FIG. 30B using a pipeline to perform feedward summing and integration.

FIG. 30F2 is a system state table for the implementation shown in FIG. 30F1.

FIG. 30G1 shows one implementation of the digital Σ modulator of FIG. 30B using a hybrid memory system.

FIG. 30G2 is a system state table for the implementation shown in FIG. 30G2.

FIG. 30H1 shows one implementation of the digital Σ modulator of FIG. 30B that attempts to reuse hardware as much as possible.

FIG. 30H2 is a system state table for the implementation shown in FIG. 30H1.

FIG. 33 shows exemplary steps needed to implement an exemplary algorithm for the test signal and modulator shown in FIG. 31.

FIG. 34 shows the actual programming loaded into microinstruction register of FIG. 31 to implement the algorithm shown in FIG. 33.

FIG. 36 shows a plurality of time lines showing an exemplary clock alignment associated with on-chip generation of clocks as shown for example in item 140 of FIG. 1.

DETAILED DESCRIPTION OF THE INVENTION

Figure 1:
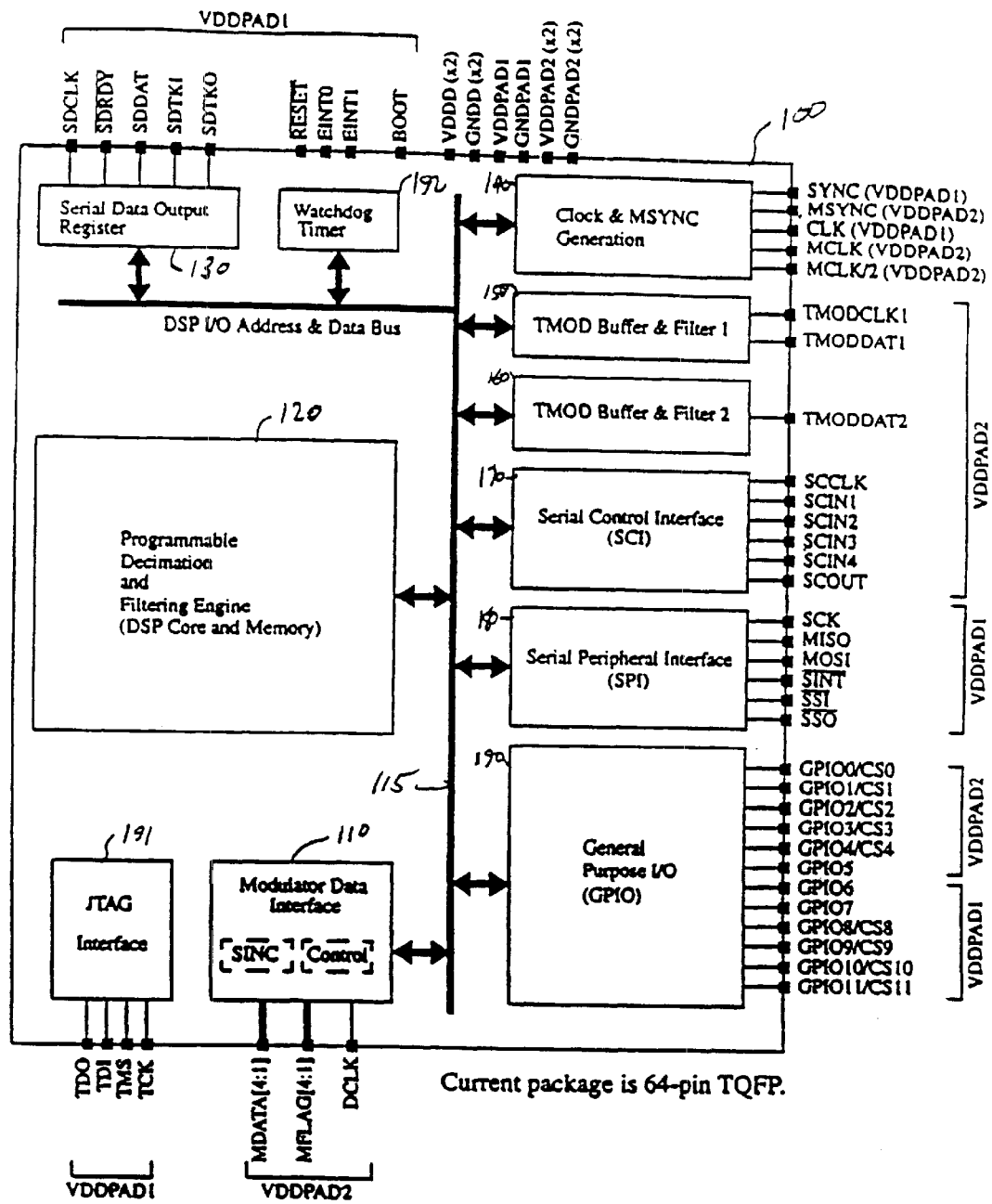
FIG. 1 is a block diagram of an integrated circuit implementing various aspects of the invention.

FIG. 1 is a block diagram of an integrated circuit implementing various aspects of the invention. Integrated circuit 100 represents a lower power programmable decimation filter in accordance with the invention. It utilizes a low power general purpose digital signal processor (DSP) 120 to achieve efficient filtering for up to four delta-sigma modulators. It is used with executable code, described hereinafter, to perform many different filter functions. These include linear and minimum phase filters at a variety of output word rates. It can service between one and four channels of incoming data, on a user selectable basis, received over modulator data interface 110. The filter decimated output is applied to serial data output register 130. A bus 115 interconnects the modulator data interface 110, programmable decimation and filtering engine 120 and serial data output register 130. In addition, the bus provides access to a clock and sync generation module 140, two test modulator buffer and filters 150 and 160, a serial control interface 170, a serial peripheral interface 180, a general purpose I/O interface 190 and a watch dog timer 192. A JTAG interface 191 is provided for testing, such as boundary scan, on the integrated circuit.

Figure 2:
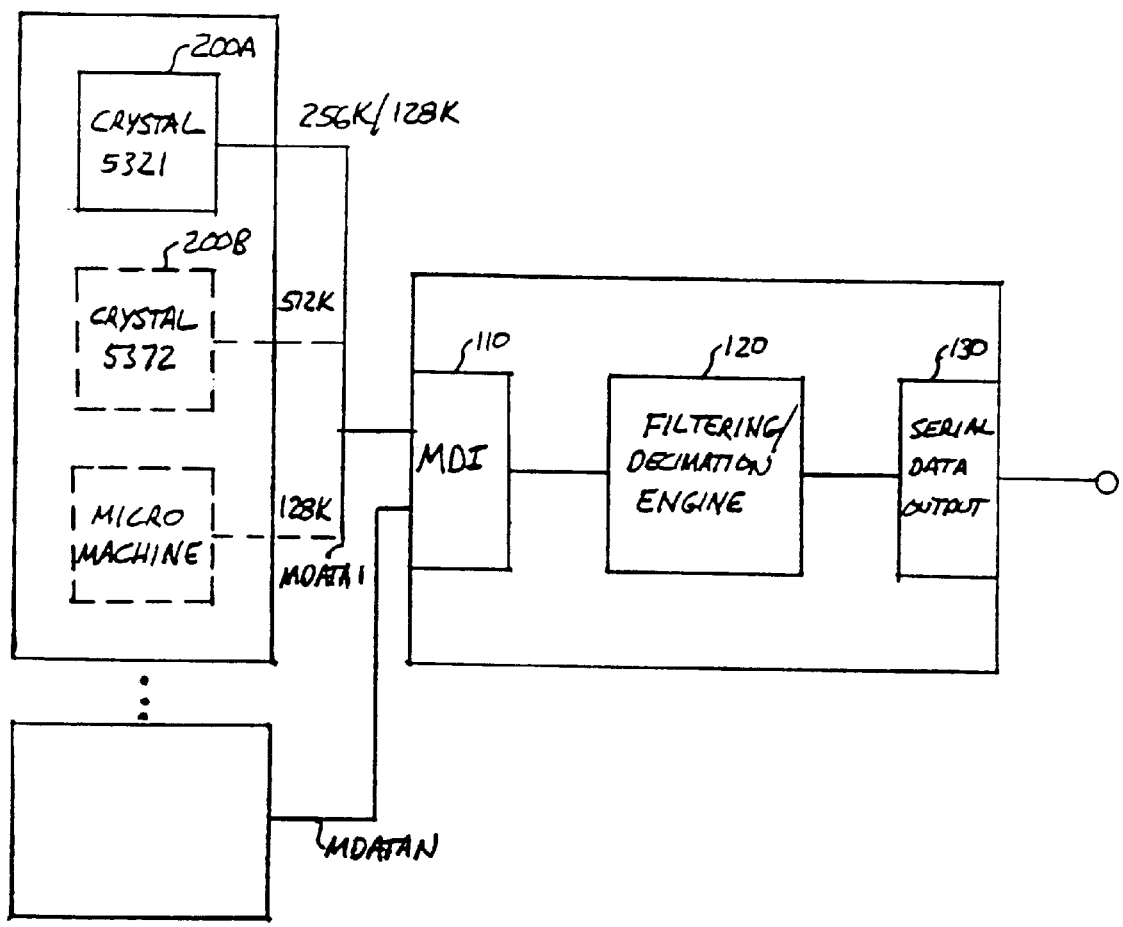
FIG. 2 is a block diagram showing various sensor modulator combinations which can be selectively utilized with the integrated circuit of FIG. 1.

FIG. 2 is a block diagram showing various sensor modulator combinations which can be selectively utilized with the integrated circuit of FIG. 1. A modulator data interface 110 of FIG. 2 is designed to accommodate a plurality of different types of sensor/modulators. Exemplary sensor modulator packages might include the CS5321 and the CS5372 chips provided by Crystal Semiconductor, Inc. of Austin, Texas. Additional sensor outputs might also be accommodated such as shown at 200C. Integrated circuit 100 is programmable to accommodate a variety of input rates and algorithms that might be utilized by various input devices.

Figure 3:
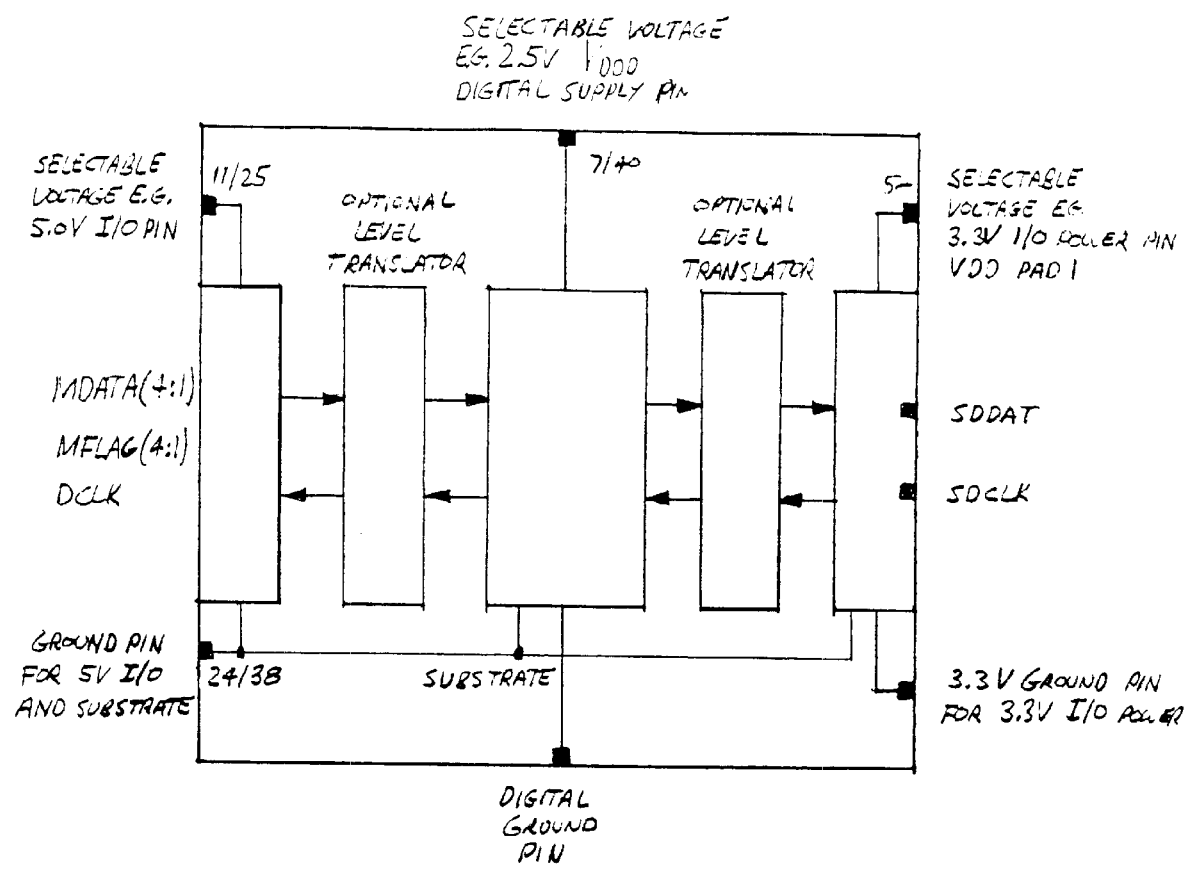
FIG. 3 is a block diagram showing a plurality of sets of power-ground combinations found on the integrated circuit illustrated in FIG. 1.

FIG. 3 is a block diagram showing a plurality of sets of power-ground systems found on the integrated circuit illustrated in FIG. 1. Integrated circuit 100 utilizes three separate power supply-ground systems. Preferably, it is selectable based on a needed or desired operating frequency. In this particular exemplary embodiment, an external 5 volt power supply is applied over pins 11/25 of the chip and serves as a power source VDDPAD2. The ground or return pins for that supply are pins 24 and 38 of the exemplary implementation chip 100. A second supply is, in this example, a 3.3 volts power pin which appears at 54 on the integrated circuit 100. The return for this 3.3 volts pin is found on pin 53. The second supply system services the output side whereas the first system service the input side. A third independent supply is found on pins 7 and 40. This one is typically 2.5 volts and supplies the digital processing circuitry on the chip. The return for this third supply is found on pins 6 and 39 of the integrated circuit 100. In the arrangement shown, the substrate of the digital processing is connected to the ground pin 24/38 of the integrated circuit chip. There are thus, three independent power supply-ground systems utilized on the chip which permits a variety of isolation and power needs to be accommodated.

Figure 4:
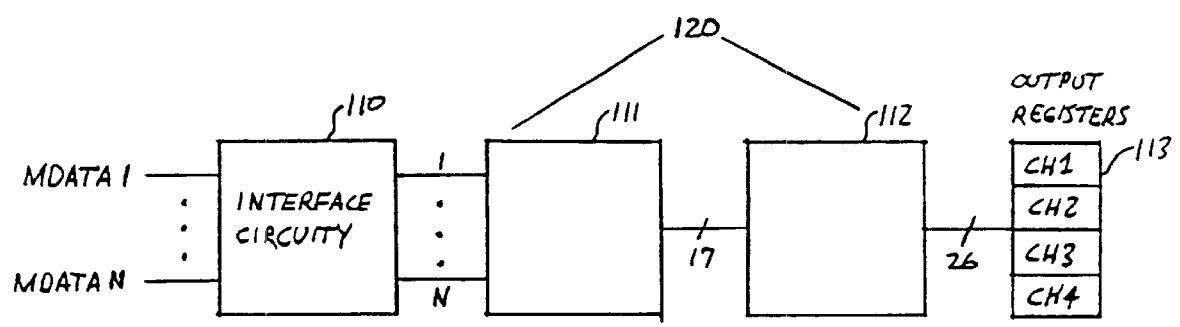
FIG. 4 is a block diagram showing the interface circuitry used to selectively interface different sensor/modulator, combinations to a decimation chain.

FIG. 4 is a block diagram showing the interface circuitry 110 used to selectively interface different sensor/modulator, combinations to a decimation chain (Sinc1 (111) and Sinc2 (112)). The input lines MDATA connect to the modulator interface 110 prior to being applied to the programmable decimation and filtering engine 120 where a decimation chain is programmably implemented.

Figure 5:
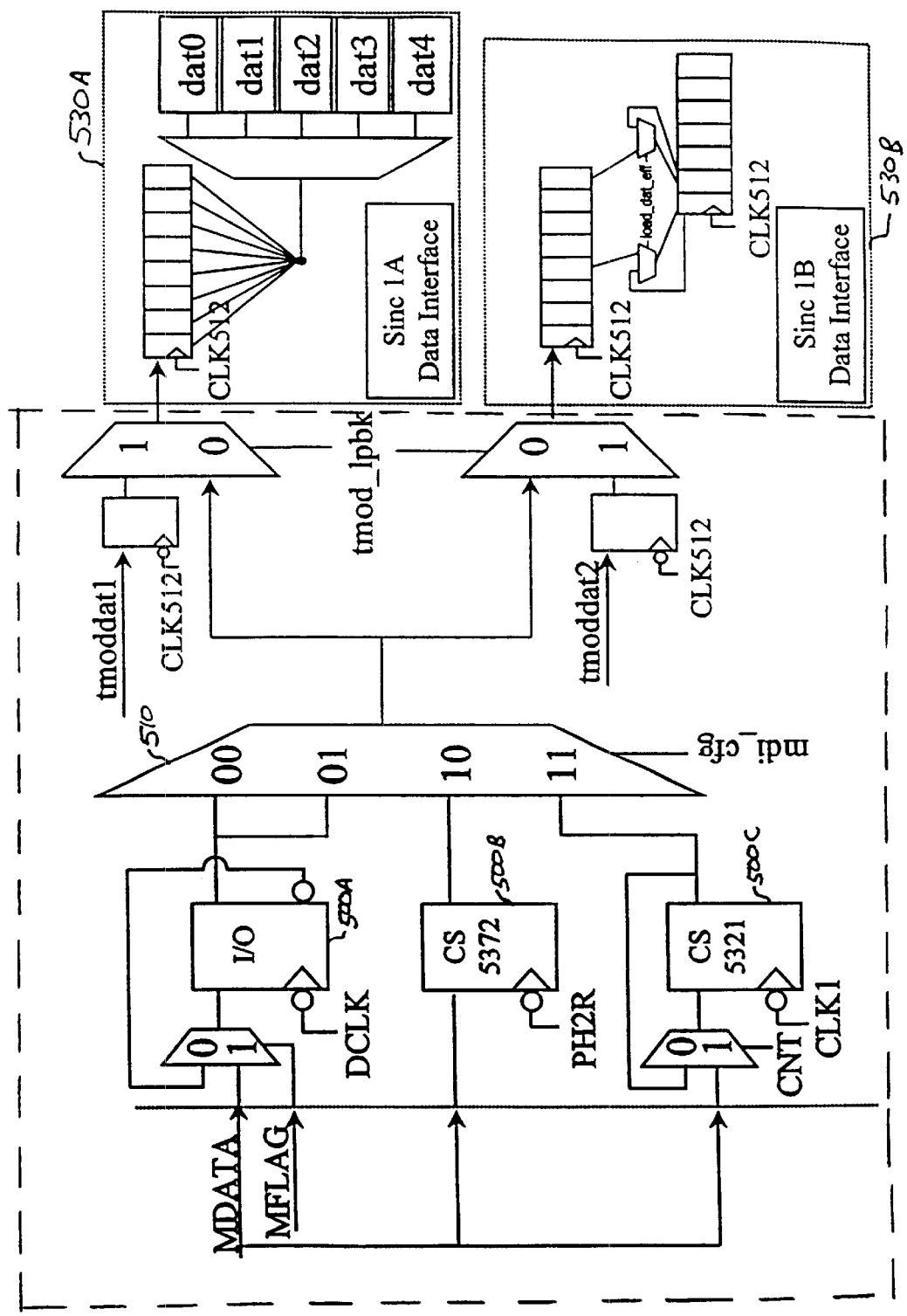
FIG. 5 is a block diagram showing the interface of FIG. 4 in more detail.

FIG. 5 is a block diagram showing the interface 110 of FIG. 4 in more detail. The input from the MDATA and MFLAG pins on integrated circuit 100 are applied in parallel, directly or indirectly to three different latches, 500A, 500B and 500C. In the exemplary embodiment shown, latch 500A is set up to handle 128 Kbps input rates, latch 500B is set to handle 512 or 256 Kbps, selectable, inputs and latch 500C is set up to handle 256 Kbps or 128 Kbps inputs. Latch 500A might be utilizable with a micromachine input data stream whereas latches 500B and 500C are utilizable with the Crystal semiconductor products previously discussed. A selector 510 is controlled by an input signal $mdi_{13}$ cfg which selects the output to be utilized for the remainder of the circuitry. The output of the selector 510 is applied to selectors 520A and 520B. Selectors 520A and 520B permit the incoming data stream to be selectively routed to the Sinc1$a$ filter input circuitry 530A or the Sinc1$b$ circuitry 530B. Selectors 520A and 520B permit the outputs of TMOD buffer and filter 1 (150) and TMOD buffer and filter 2 (160) to be applied, selectively, to the inputs of the Sinc1 a interface 530A and the Sinc1$b$ interface 530B, respectively.

Figure 6:
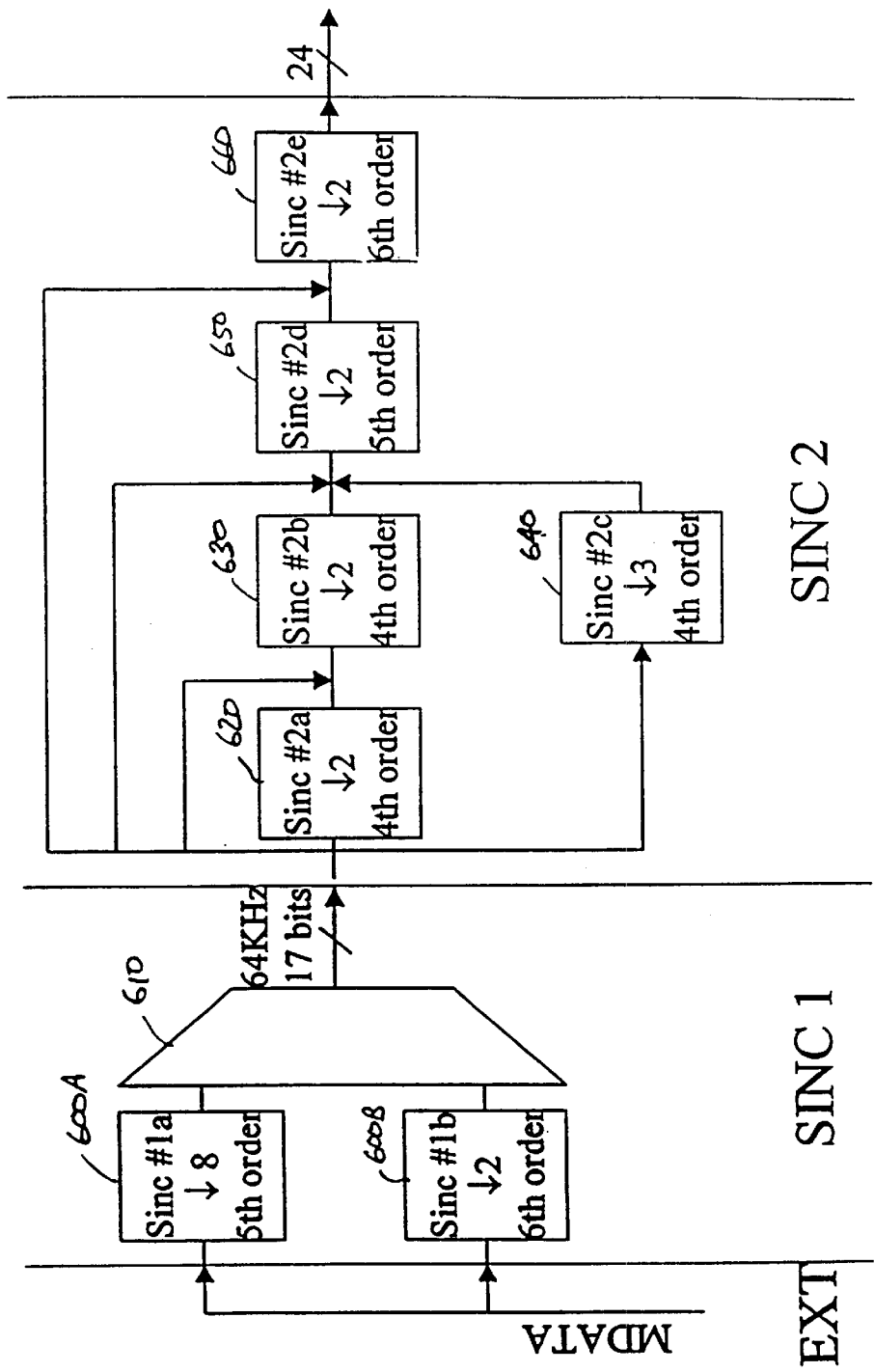
FIG. 6 shows the sinc decimation chain including selectable front ends.

FIG. 6 shows the Sinc decimation chain 120 including selectable front ends. The outputs from the Sinc1$a$ interface 530A and the Sinc1$b$ interface 530B from FIG. 5 are applied to Sinc1 filters which can be selectively activated. The Sinc1$a$ and Sinc1$b$ filters are preferably implemented in hardware. The Sinc1$a$ filter 600A is a 5th order decimate by 8 Sinc filter. Sinc filter 1$b$ (600B) is a decimate by 2, 6th order Sinc filter. The output of the Sinc1$a$ filter and the Sinc1$b$ filter are applied to selector 610 which produces a 64 kHz output at 17 bits wide. This output serves as the input to the Sinc2 filter chain which is comprised of a plurality of Sinc filters, preferably implemented in software including, in this example, Sinc2$a$ (620), Sinc2$b$ (630), Sinc2$c$ (640), Sinc2$d$ (650) and Sinc2$e$ (660). The arrows depicted in the Sinc2 area of FIG. 6 represent different paths that can be selectively followed by the data, in accordance with programming direction, to implement a programmable Sinc filter. Thus, Sinc2 is a programmable Sinc filter with variable decimation ratios ranging from 2 through 16.

FIG. 7 indicates the mathematical representation of a 5th order decimate by 8 Sinc filter. Coefficients for one half of the symmetrical set are also given.

Figure 8:
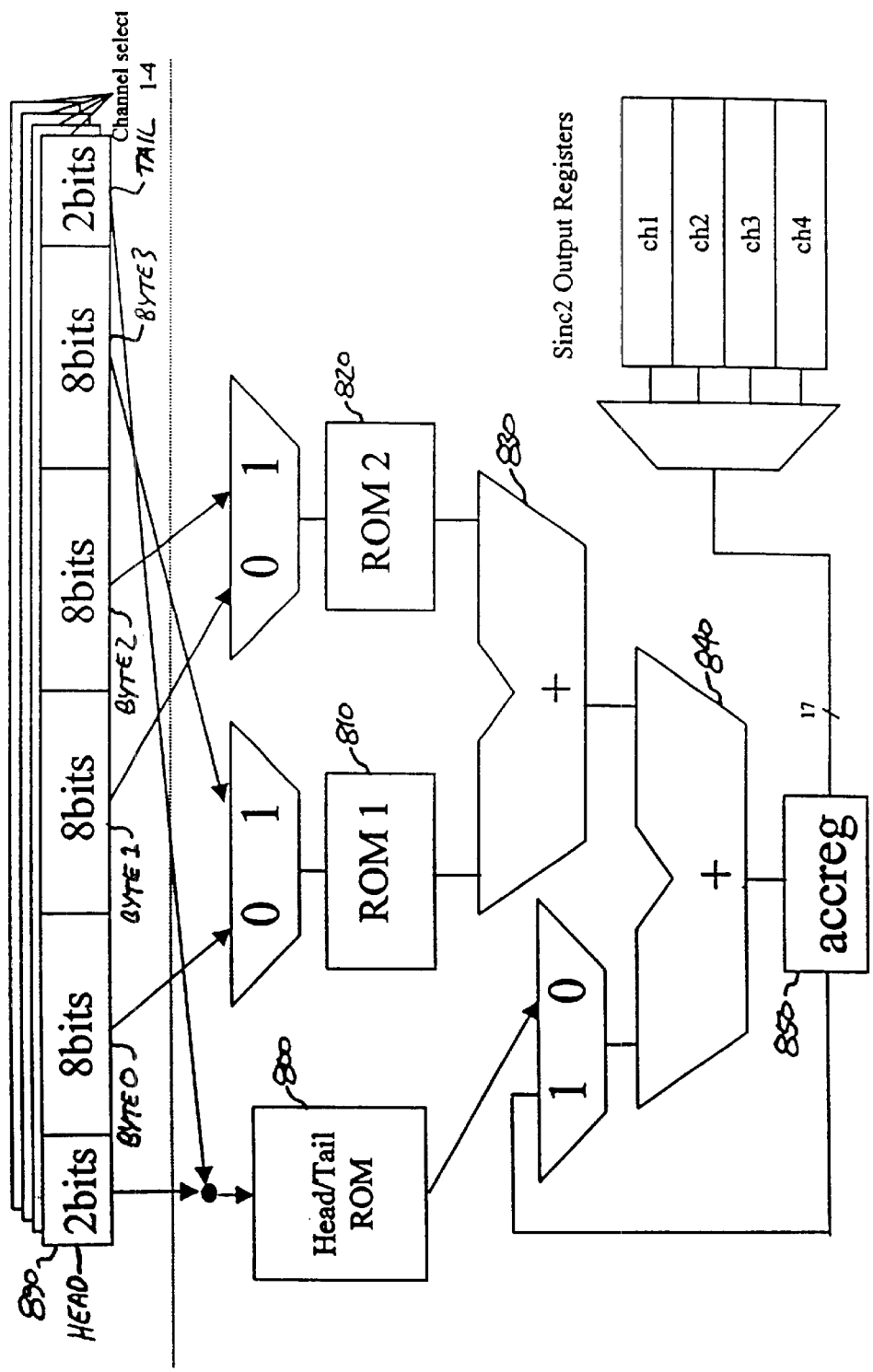
FIG. 8 is a block diagram of the Sinc1A implementation in accordance with the invention.

FIG. 8 is a block diagram of the Sinc1$a$ implementation in accordance with the invention. The incoming data bits from a data stream are represented as if they were loaded from head to tail in a register 890. The use of a register as a memory element represents a convenient representation but other forms of memory may be used. The head 2-bits and the tail 2-bits are read into ROM 800. ROM 1 (810) and ROM2 (820) receive byte-0 and byte-1, respectively, from the data stream. These bytes are summed in adder 830 and then summed with the output of the head tail ROM in adder 840 to create an interim sum at register 850. During a second phase, ROM 1 receives byte-3 and ROM 2 receives byte-2 from the data stream in twisted ($bit$ reversed) order. The output of ROM 1 and ROM 2 is then summed at 830 and summed with the output of the register 850 from the previous stage to produce a final answer.

This architecture is based on using look up tables instead of performing multiplications. The coefficients are symmetric and this permits one to use one half the expected number of look up tables.

The Sinc1$b$ filter is represented mathematically as shown in FIG. 9. The impulse response of this filter is shown mathematically in this figure as well.

Figure 10:
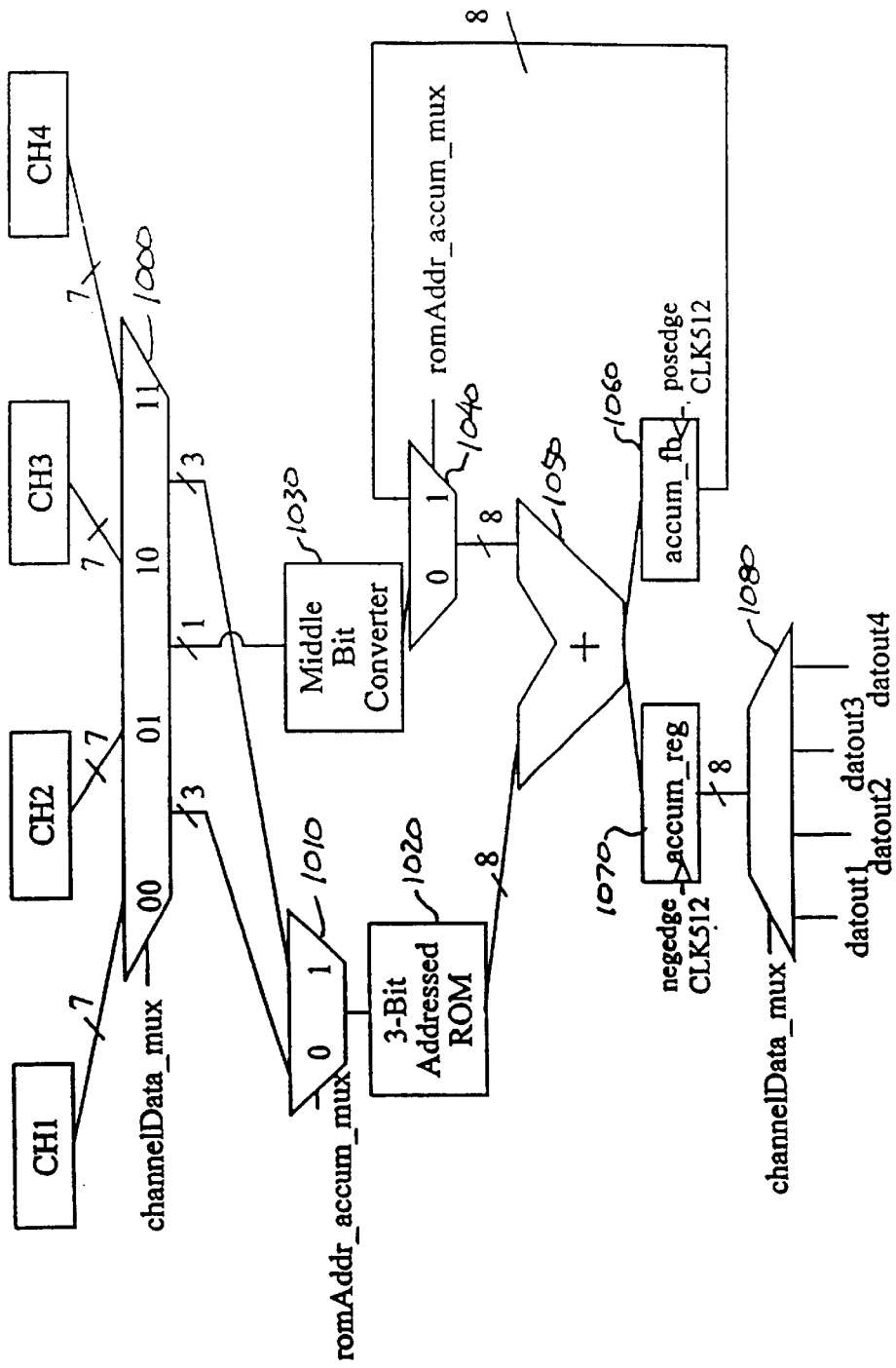
FIG. 10 is a block diagram showing an exemplary implementation of the Sinc1B filter in accordance with the invention.

FIG. 10 is a block diagram showing an exemplary implementation of the Sinc1$b$ filter in accordance with the invention. Data from one of the incoming channels is selected using multiplexor 1000 based on 2-bits of signal channel-$Data_{13}$ mux. During a first phase (Phase 0) the first 3-bits of the channel word are applied through selector 1010 to the address input of a 3-bit ROM 1020. The middle bit from the word is applied to middle bit converter 1030 which generates a constant value. The output of the middle bit converter and the output of the 3-bit addressed ROM is applied to adder 1050 and the results stored in register 1060 on the positive edge of a 512 CLK. During the second phase (Phase 1) the last 3 bits are twisted (i.e. applied in bit reversed order) and used as an index into the ROM 1020. The sum of the output of the addressed ROM 1020 is added to the contents of temporary register 1060 and the result applied to an accumulate register 1070 for output to the selected data channel using multiplex 1080.

FIG. 11 is a table showing the mathematical representation and the filter taps for the Sinc2($a$), Sinc2($b$), Sinc2($c$), Sinc2($d$) and Sinc2($e$) filters.

Figure 12:
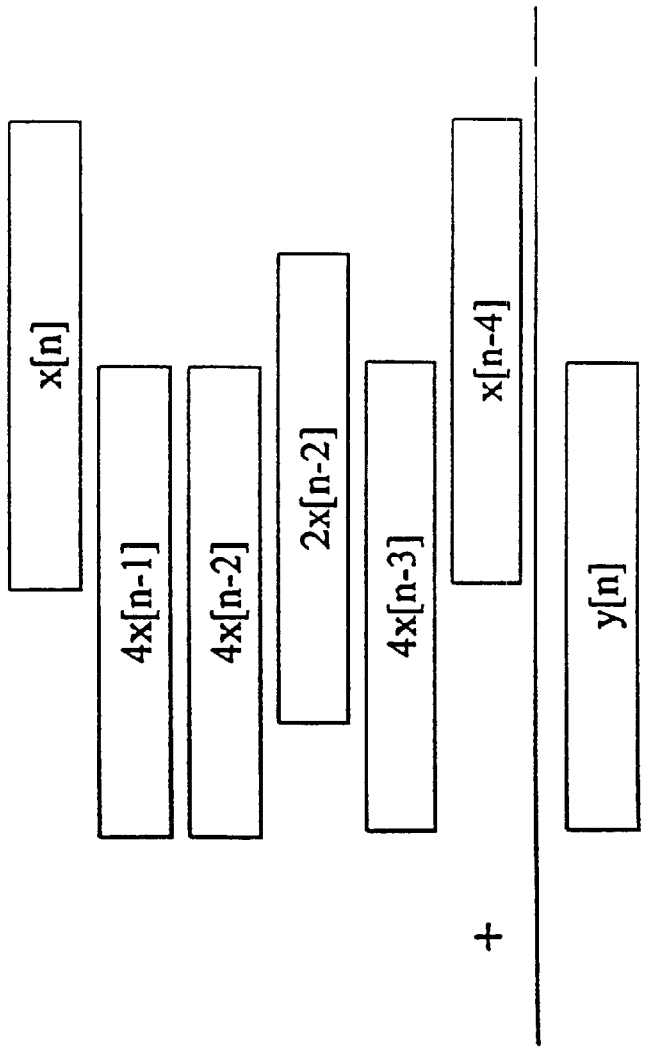
FIG. 12 is a representation of the Sinc2($a$) and 2($b$) filters, showing the shifts and adds utilized to implement the filters.

FIG. 12 is a representation of the Sinc2($a$) and 2($b$) filters, showing the shifts and adds utilized to implement the filters.

FIGS. 13A, 13B and 13C show the shift add implementation of Sinc filters Sinc2($c$), Sinc2($d$) and Sinc2($e$), respectively.

FIGS. 14A and 14B show the accumulate phase and the output phase, respectively which can be utilized to implement the filter of Sinc2$a$ and Sinc2$b$.

FIGS. 15A and 15B show the accumulate phase and the output phase which can be utilized to implement the Sinc filter Sinc2$d$.

Figure 16A:
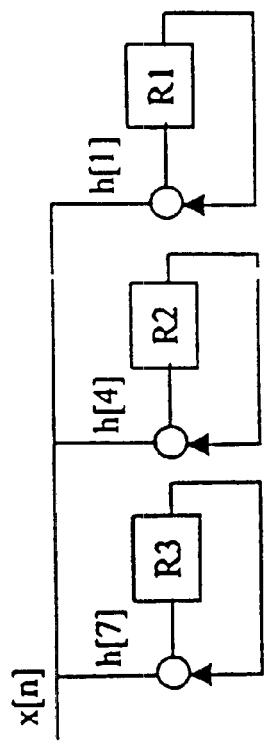
FIGS. 16A, 16B and 16C show implementation of the Sinc2($c$) filter with its accumulate phase A, accumulate phase B and output phase representations.
Figure 16B:
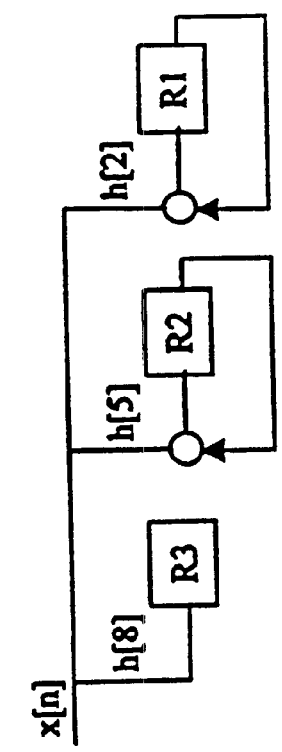
Figure 16C:
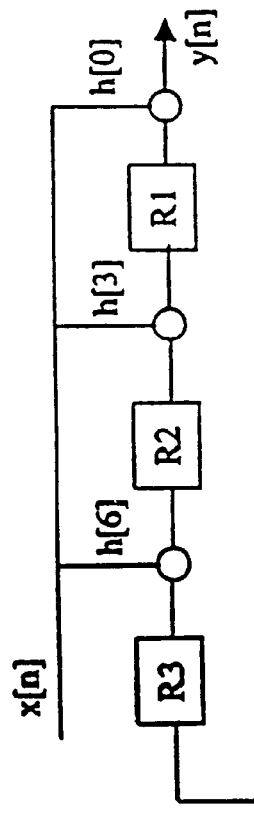

FIGS. 16A, 16B and 16C show implementation of the Sinc2($c$) filter respectively in an accumulate phase A, accumulate phase B and output phase representations. FIGS. 16A and 16B represent two accumulate phases for implementing the Sinc2$c$ filter. FIG. 16C represents an output phase. These two accumulate in phases and one output phase can be utilized to implement the Sinc2$c$ filter.

Figure 17A:
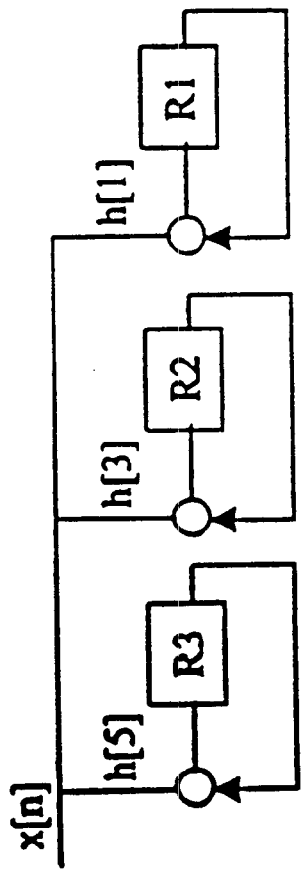
FIGS. 17A and 17B illustrate the implementation of the Sinc2($e$) filter in an accumulate phase and an output phase, respectively.
Figure 17B:
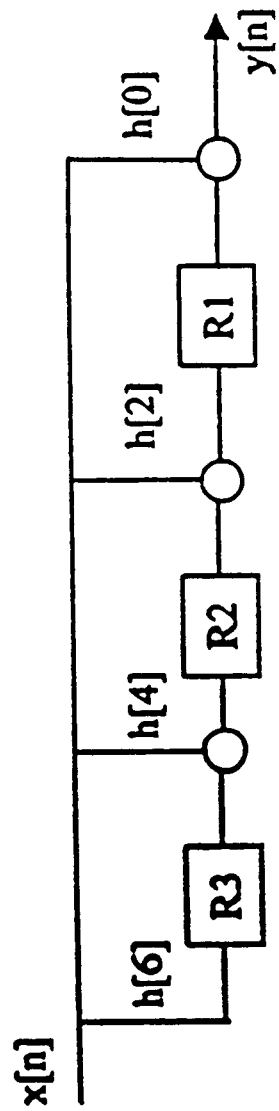

FIGS. 17A and 17B illustrate the implementation of the Sinc2($e$) filter in an accumulate phase and an output phase, respectively. FIG. 17A illustrates the accumulate phase and FIG. 17B illustrates the output phase of an implementation which can be utilized to implement the Sinc2$e$ filter.

Once each of the many Sinc filters have been arranged for shifts and adds and organized into accumulator and output subroutines, one needs to arrange the order of the execution of the subroutines to accommodate all the calculations. The number of additions/subtractions one can perform is based on the spacing between input values received from Sinc1. Because Sinc2 runs at 512 kHz, for an input from Sinc1 of 64 kHz, we have the ability to do eight addition/subtractions per input word.

FIGS. 18A though 18I show implementation of the Sinc2 filter with the accumulate-output architecture used with time multiplexing. This shows an example of the spacing and time allocation which can be utilized to perform the accumulate outputs steps needed for implementing the Sinc2 filters on an ongoing basis. The example implements a decimate by 16 in Sinc2. A different arrangement would be required for different decimation rates in Sinc2. Exemplary code for implementing this is shown in an Appendix.

Figures 19A, 19B:
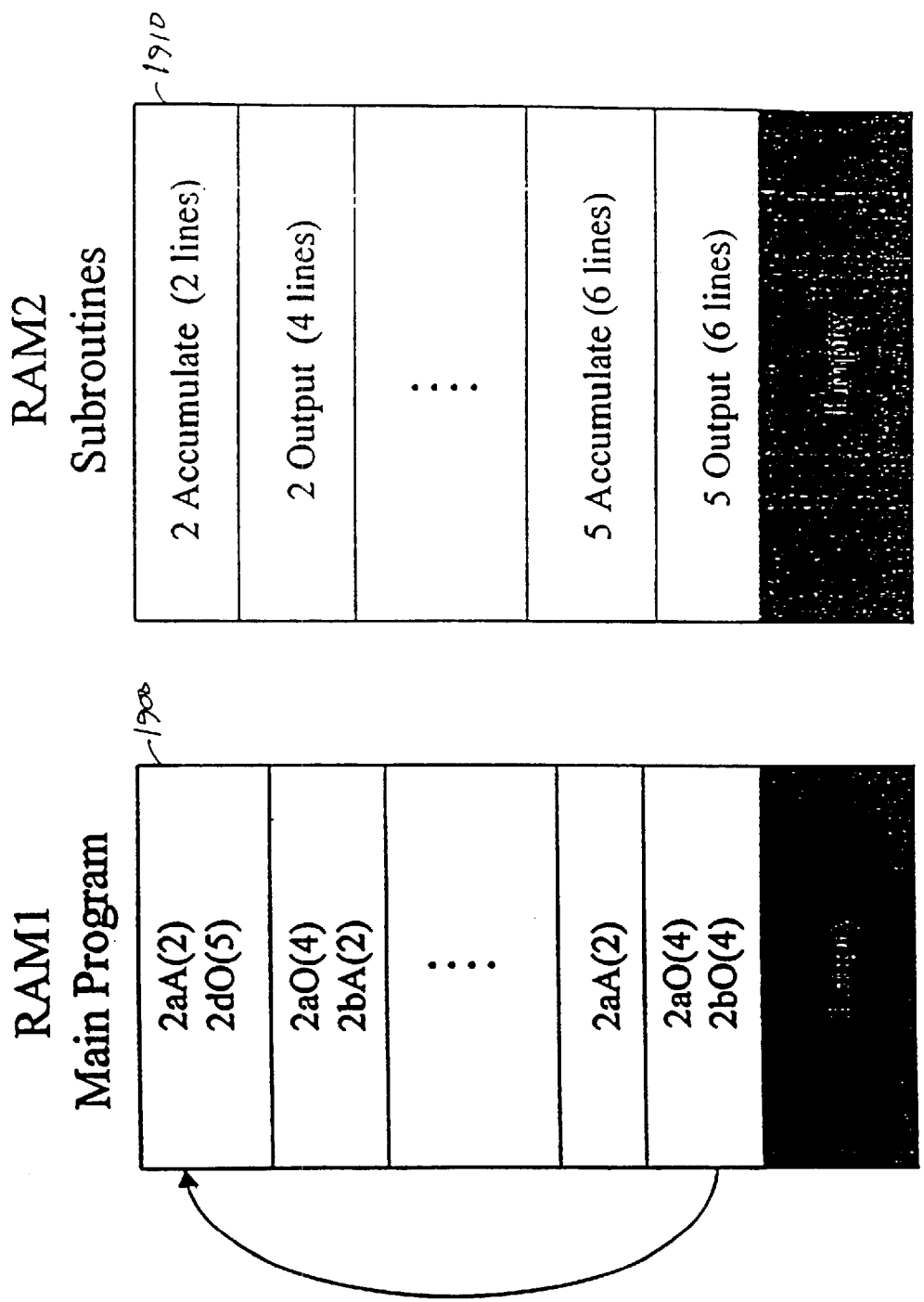
FIGS. 19A and 19B are memory diagrams showing the relationship between the main program and the subroutines used to implement the Sinc filters.

FIGS. 19A and 19B are memory diagrams showing the relationship between the main program and the subroutines used to implement the Sinc filters. The programming structure of the Sinc2 filters utilizes a plurality of subroutines called from a main program. In FIG. 19 the main program is shown implemented in RAM 1, the subroutines are shown implemented in RAM 2. Each statement in the main program will call the subroutines of RAM 2 for execution.

Figure 20A:
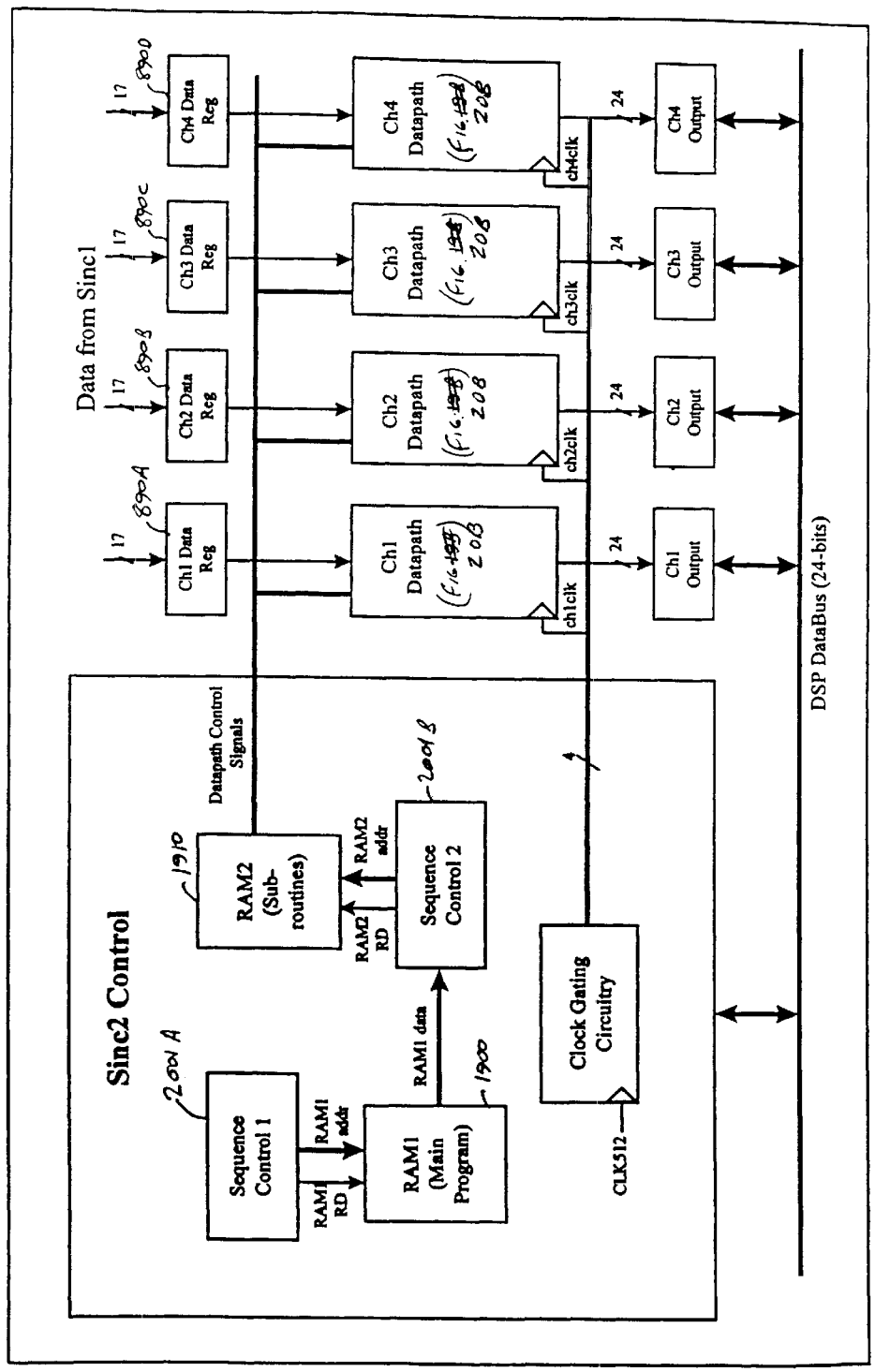
FIG. 20 is a block diagram showing an architecture for carrying out the adds and shifts needed to implement the Sinc2 filter.

FIG. 20A shows a control-datapath architecture for implementing the Sinc2 filters. Sequence control 1 (2001A) involves a read state or RAM1 at a specified address. The contents of RAM1 points to an entry point for a subroutine located in RAM2. Sequence control 2 involves a read beginning at that entry point and sequences through the instructions of the subroutine and outputting those instructions as datapath control signals. The datapath itself is shown in FIG. 20B.

Figure 20B:
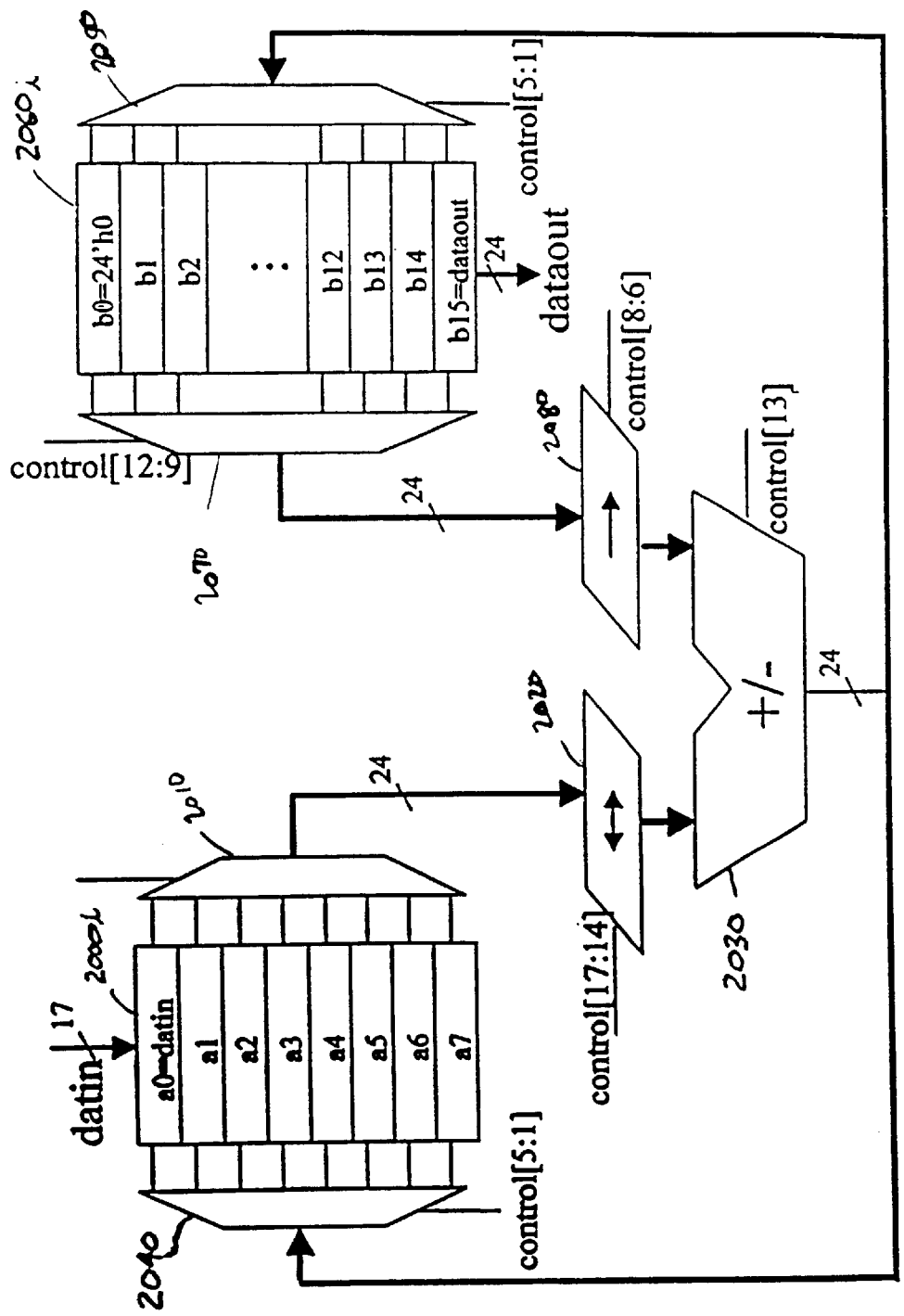

FIG. 20B describes an architecture for implementing the Sinc2 channel Datapath. Data is read into a plurality of registers $2000i$ where i represents the number of the register. The contents of a particular register can be selected by selector 2010 and applied to shifter 2020 which can shift at left or right as needed. The output of shifter 2020 is applied to add or subtractor 2030, the output of which is fed both the input of the register set $2000i$ by a selector 2040 or to the input of selector 2050 for application to a register of register set $2060i$. Contents of a particular register can be selected using selector 2070 and applied to shifter 2080 where it can be selectively shifted and then the output of 2080 is applied to add or subtractor 2030. Where it can be selectively added to the contents output from shifter 2020.

The steps which can be utilized to create a program for operating the Sinc filters will be described with respect to an example.

Step 1—Chose the desired decimation rate. In this example, we will utilize 16.

Step 2—Select which filters need to be involved in the decimation. This can be done conveniently by reference to FIG. 6, where one can readily see that mini-sinc filters $2a$, $2b$, $2d$ and $2e$ can be utilized to achieve a decimation ratio of 16.

Step 3—Separate coefficients into form suitable for shift-add operations. This can be done from the mathematical representation using an approach similar to that shown in FIG. 12.

Step 4—Check for overflow after each addition in the filter. See the discussion of FIG. 22 which follows.

Step 5—Perform the necessary truncation to 24-bits and scaling of subsequent coefficients in mini-sincs. See the discussion of FIG. 22.

Step 6—Time multiplex accumulate in output subroutines so that a maximum of eight operations can occur from each input from Sinc1.

Step 7—Create code for RAM2 (Accumulate and Output Subroutines) in the form: [Coeff 1] [Src 1] [Src 2] [Dest] [Coeff2] [Done Subroutine].

Step 8—Create code for RAM1 (Main Control code): [Line #] [Wait for new data] [Done program].

FIG. 21 is a flow chart reflecting these steps.

Figure 22:
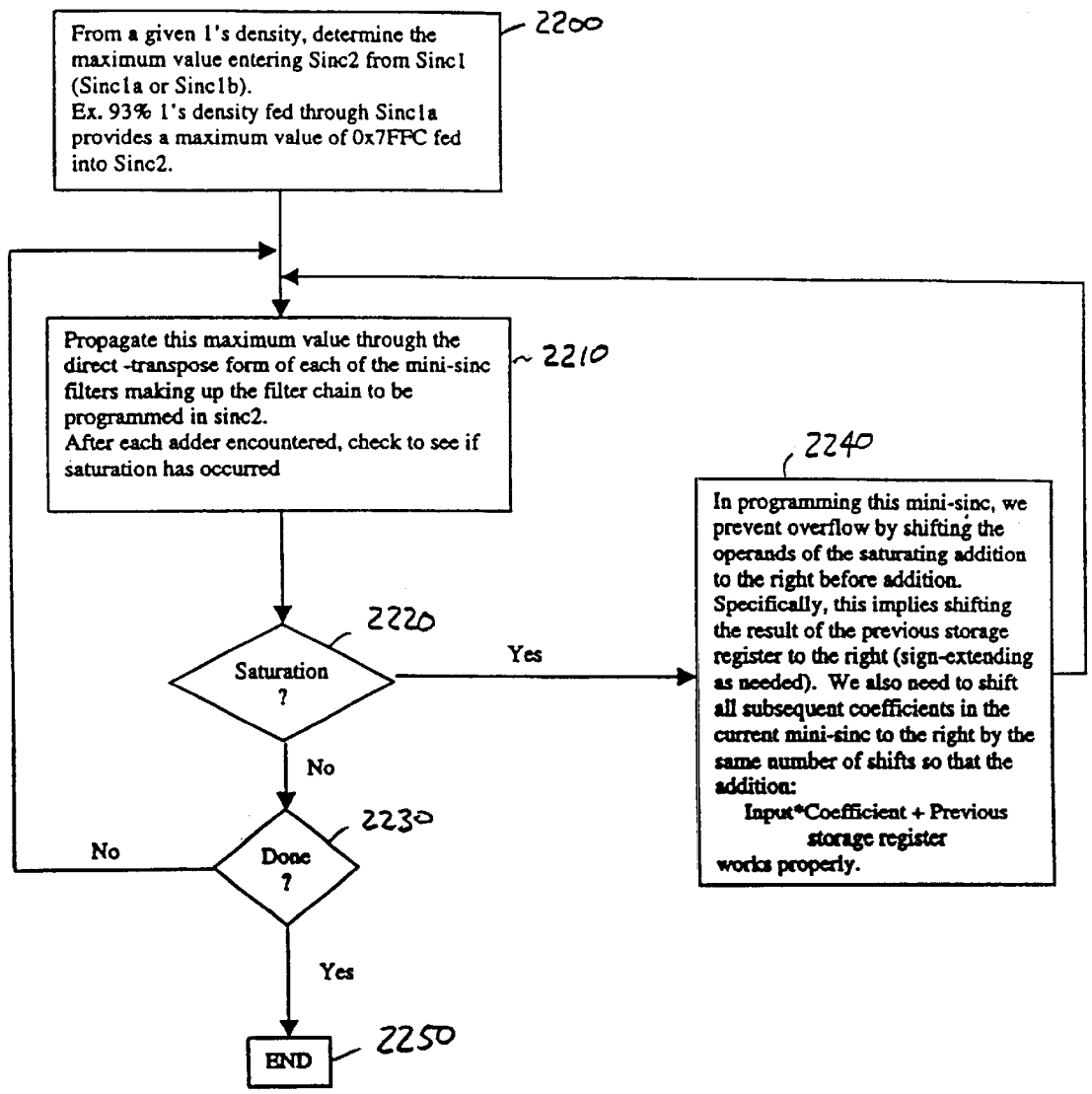
FIG. 22 is a flow chart of a process for determining coefficients to prevent overflow in internal registers when implementing the Sinc filters.

FIG. 22 is a flow chart of a process for determining coefficients to prevent overflow in internal registers when implementing the Sinc filters. This flow chart describes a process by which one can check filter coefficients to overflow in internal registers. From a given 1's density, one determines the maximum value entering Sinc2 from Sinc1 (Sinc1$a$ or Sinc1$b$) (2200). One then propagates this maximum value through the direct-transposed form of each of the mini-sinc filters making up the filter chain to be programmed in Sinc2 (2210). After each adder is encountered, one checks to see if saturation has occurred. If saturation has occurred (2220-yes) to prevent overflow, one shifts the operands of the saturation in addition to the right before addition. Specifically, this implies shifting the result of the previous storage register to the right (extending as needed). One also needs to shift all subsequent coefficients in the current mini-sinc to the right by the same number of shifts so that the addition "Input*Coefficient+previous storage register" works properly. Once that is done, one returns to step 2210.

If saturation does not occur (2220-no), one checks (2230) to see if the complete Sinc filter processing has been completed, if not, one returns to step 2210 for further processing. If processing has been completed (2230-yes), the process ends (2250).

Figure 23:
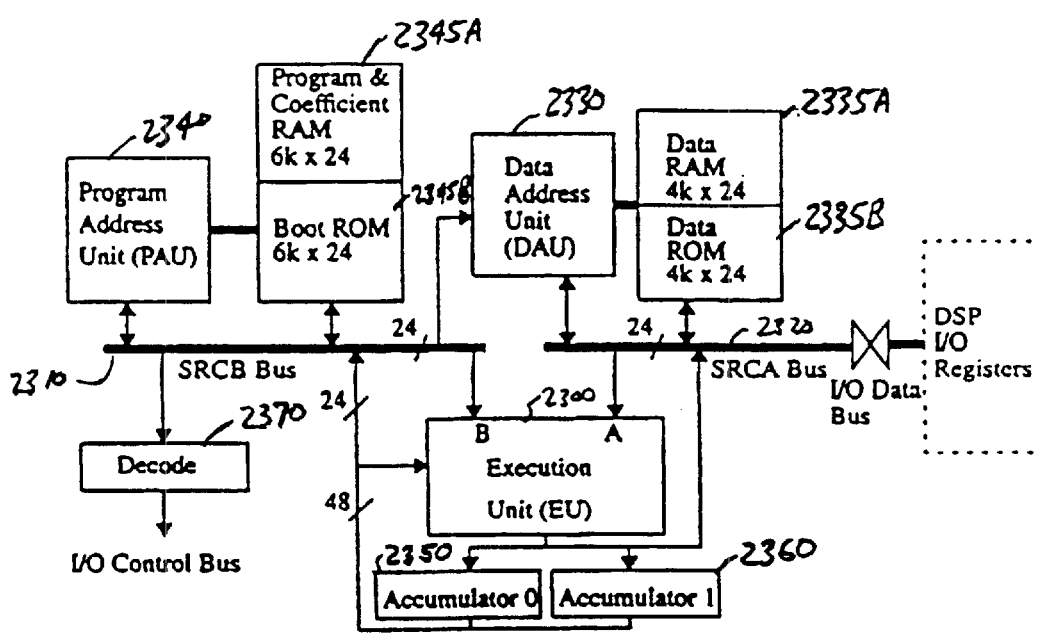
FIG. 23 is a block diagram of a DSP utilized for filtering and decimation in accordance with the invention.

FIG. 23 is a block diagram of a DSP utilized for filtering and decimation in accordance with the invention. The DSP utilized as the filtering and decimation engine 120 of FIG. 1 has an execution unit 2300 which services two buses, an SRCA bus 2320 and an SRCB bus 2310. The SRCB bus has a program address unit 2340 and boot ROM 2345B and program and coefficient RAM 2345A, a data address unit 2330 is connected both to bus 2310 and to bus 2320. Data RAM 2335A and Data ROM 2335B are also connected to SRCA bus 2320. Data comes in and out over a bus 2320 by DSP I/O registers (shown in dashed). The execution unit 2300 has access to accumulators 2350 and 2360. These may be independently accessed over the bus 2320. A decoder 2370 interfaces the SRCB bus 2310 with an I/O control bus.

Figure 24A:
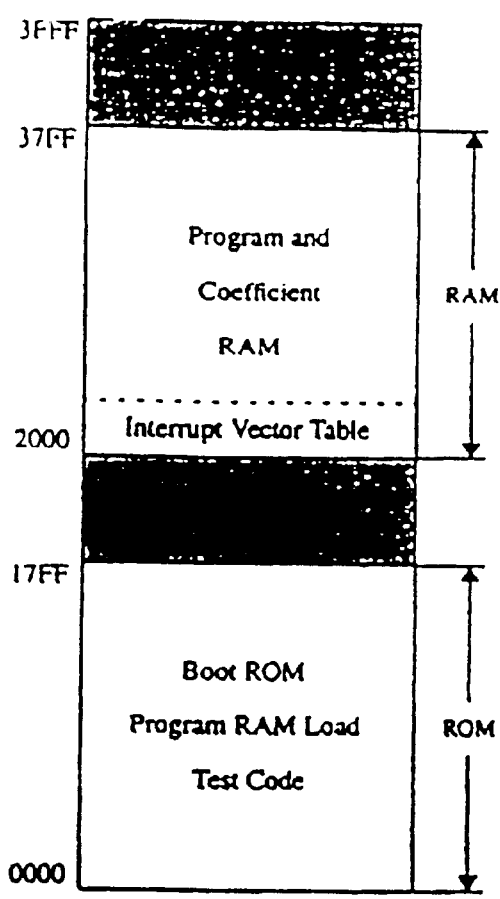
FIGS. 24A and 24B show the address segmentation of the program and data address space for the DSP.
Figure 24B:
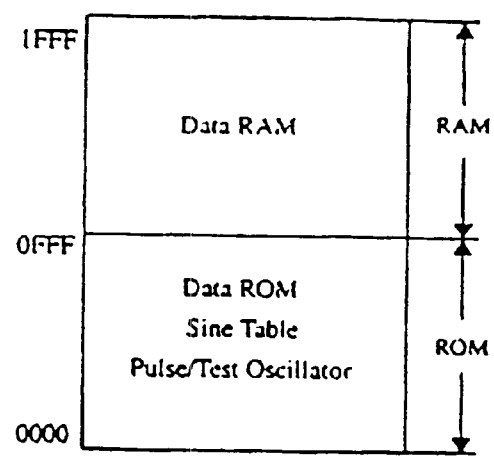

FIGS. 24A and 24B show the address segmentation of the program and data address spaces for the DSP. The data memory space may be partitioned between RAM and ROM as shown or may be implemented in RAM alone, without any ROM.

Figure 25:
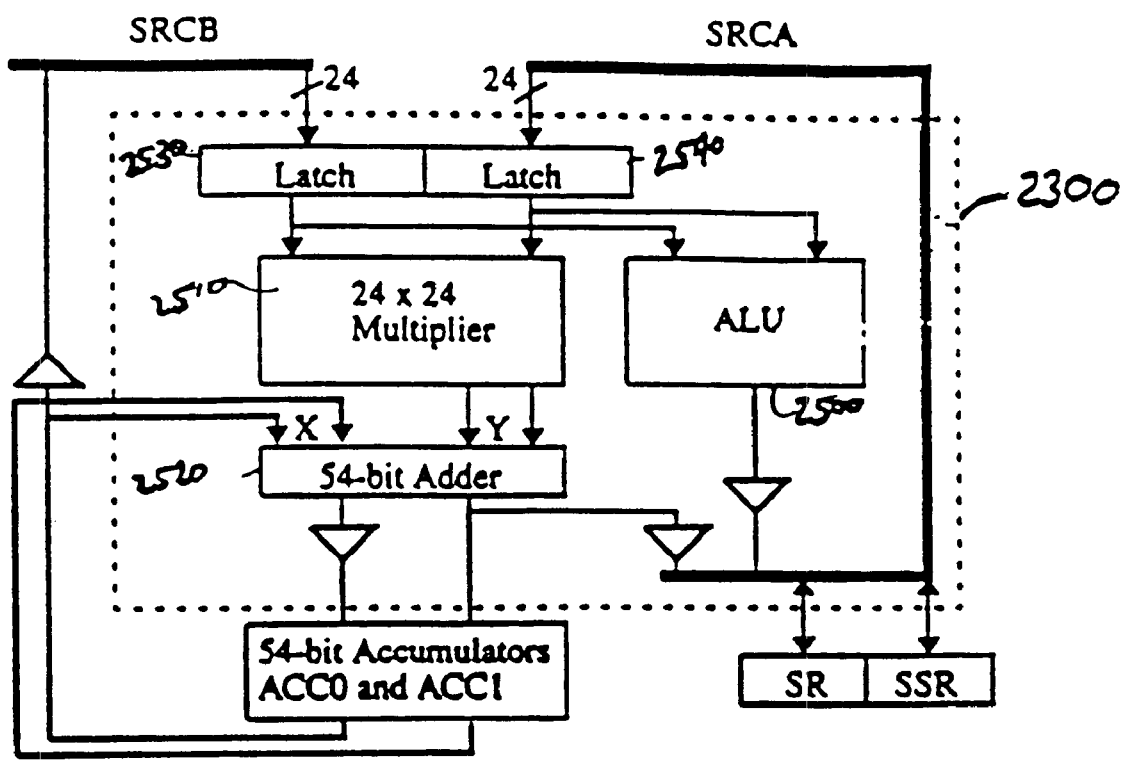
FIG. 25 shows the implementation of the. execution unit shown in FIG. 23.

FIG. 25 shows the implementation of the execution unit shown in FIG. 23. The execution unit 2300 is shown more in detail in this figure. Data is received from the SRCA and SRCB buses via 24-bit latches 2540 and 2530, respectively. An arithmetic logic unit 2500 can receive the output from the latches. A 24×24 multiplier 2510 and a 54-bit adder 2520 complete the execution unit.

Figure 26:
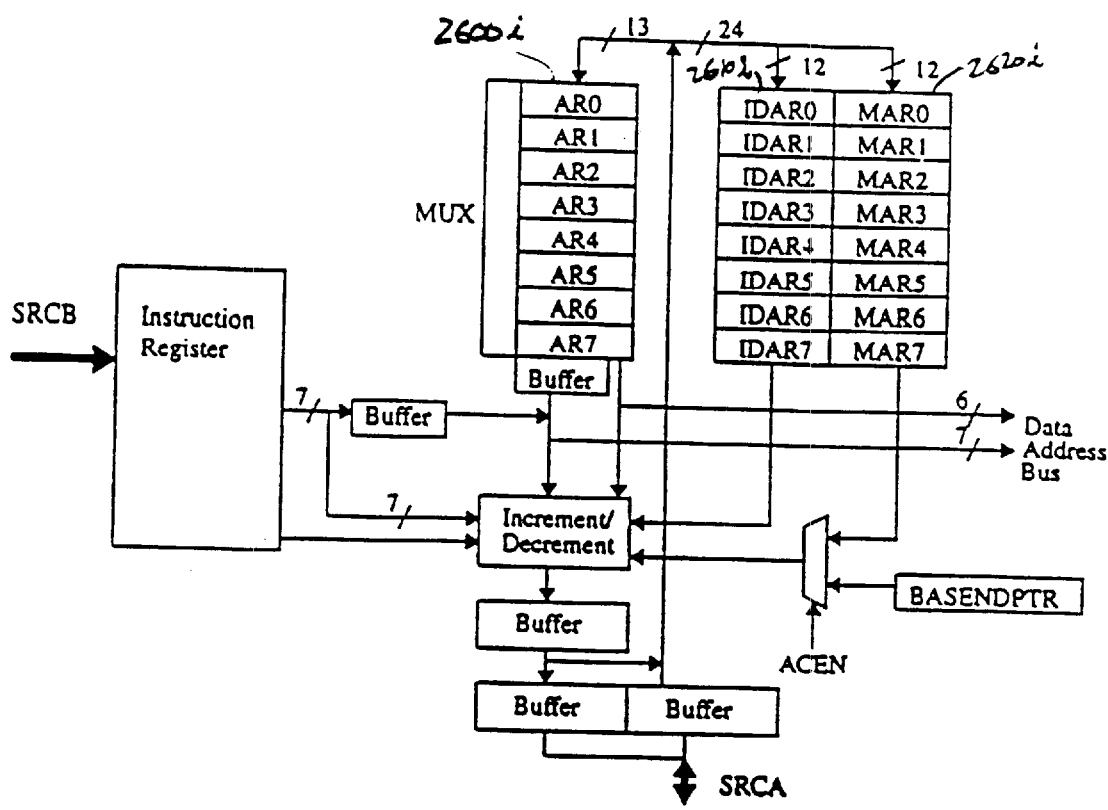
FIG. 26 shows the data address unit shown in FIG. 23 in more detail.

FIG. 26 shows the data address unit shown in FIG. 23 in more detail. The data address unit contains three register sets $2600i$ (AR0–AR7), $2610i$ (IDAR0–IDAR7) and $2620i$ (MAR0–MAR7). An instruction word received from bus SRCB can independently specify both the A operand and the destination. The A operand can be the contents of an AR, IDAR, MAR or I/O register. It can also be a location in data memory. The register sets are available for direct addressing by the DSP. When A operand is a location in data memory, the instruction word can specify the 7 least significant bits of the data memory address (direct addressing) or an address reference which contains a data memory address (register indirect addressing).

Figure 27:
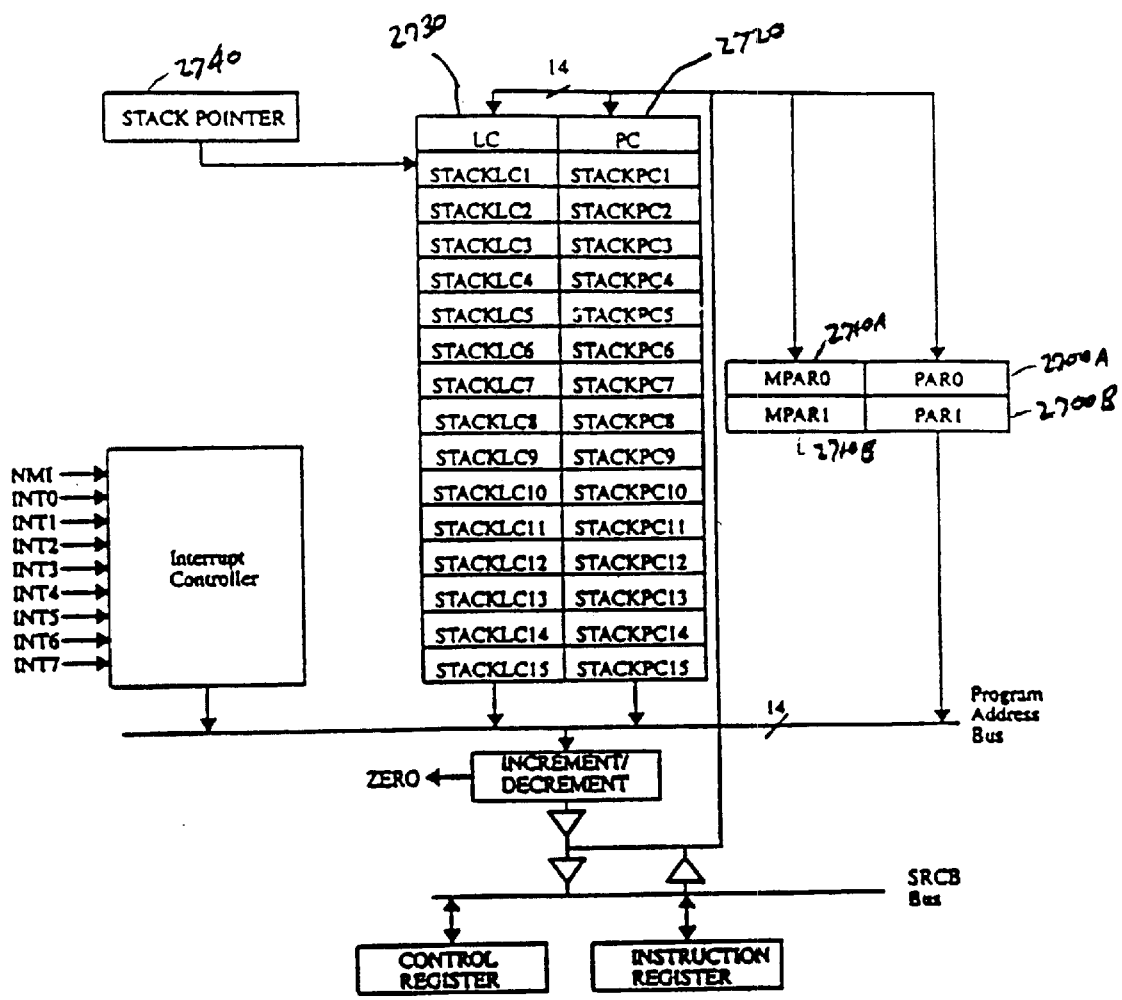
FIG. 27 shows the program address unit of FIG. 23 in more detail.

FIG. 27 shows the program address unit of FIG. 23 in more detail. The program address unit consists of two 14-bit Program Address Registers (PAR) 2700A and 2700B, two 14-bit Modulo Program Address Registers (MPAR) 2710A and 2710B, the 14-bit Program Counter (PC) 2720 a 14-bit Loop Counter 0(LC) 2730 and 15 stack locations each for the PC and LC. There is also a stack pointer which points to the current PC and current LC.

Figure 28:
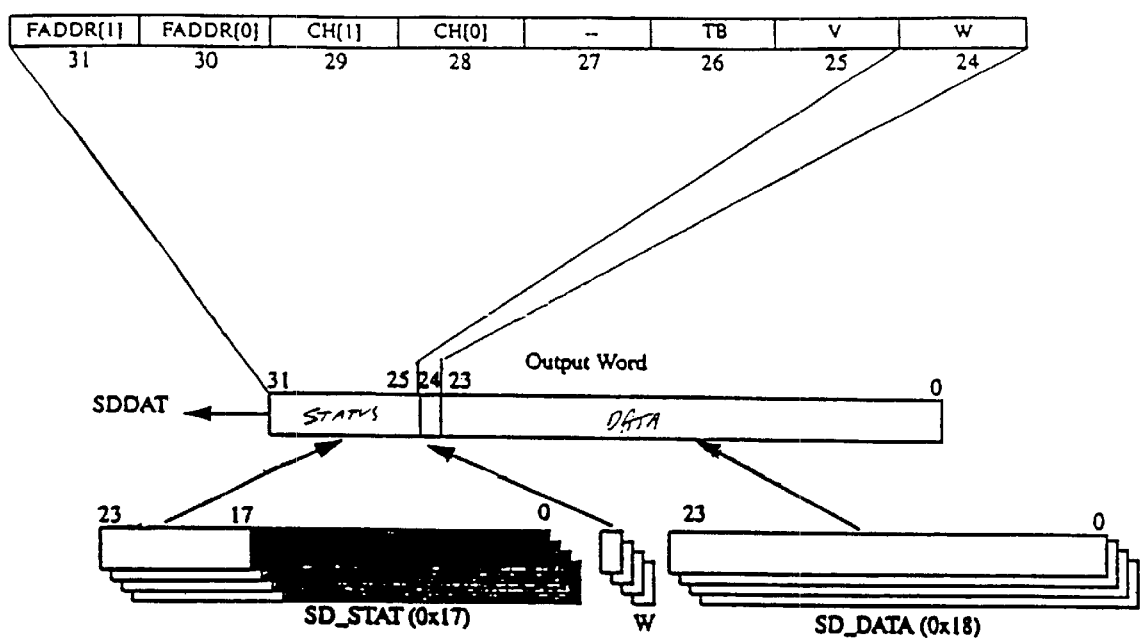
FIG. 28 shows the structure of an SDOR output data word and mapping of the internal registers to the output word.

FIG. 28 shows the structure of a Serial Data Output Register 130 (SDOR) output data word and mapping of the internal registers to the output word. The serial data output register 130 of FIG. 1 consists of two 24-bit internal registers, $SD_{13}$ STAT containing status and control bits, and $SD_{13}$ DATA, containing the data. Internally, these are at least 4-deep FIFOs to store up to four data words to be output. Preferably, they are 8 deep. These internal registers are mapped to the output word as shown in FIG. 28. The word is essentially divided into three parts, the first is a status component, the second is an overwrite bit and the third is a data word. 2-bits of the status words represent the filter address (0 through 3). 2-bits represent the modulator channel number (channel 1 through channel 4) an additional bit indicates whether a time break will be utilized, 1-bit indicates whether data from the DSP or Sinc modulator has overflowed. The W-bit indicates that channel data has been overwritten. The W-bit indicates a port overflow condition and is set by hardware when the DSP overwrites a register whose data has not been sent.

Figure 29:
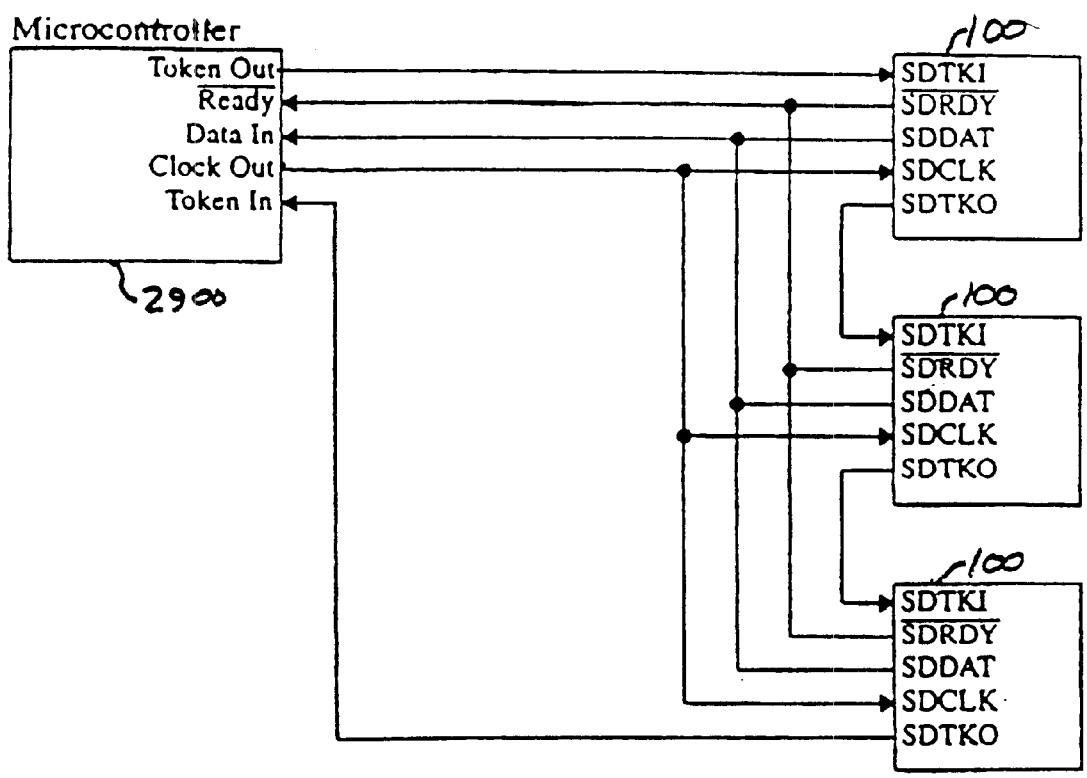
FIG. 29 shows connection of a plurality of the integrated circuits shown in FIG. 1 to operate in a daisy chained serial data token arrangement.

FIG. 29 shows connection of a plurality of the integrated circuits shown in FIG. 1 to operate in a daisy chained serial data token arrangement. Integrated circuit 100 of FIG. 1 can be connected in a bus arrangement shown in FIG. 29. It uses a bus token scheme which operates as follows. The filters are daisy chained as illustrated in FIG. 29 so that the SDTKO pin on one filter connects to the SDTKI pin on the next filter in the chain. When a filter finishes transmitting all of its data words, it enables the output buffer on SDTKO so that the next filter in the chain can latch the token bit input on the SDTKI pin. If a filter does not have any data to transmit it immediately shifts the token bit to the next node. If the filter receives a bus token while $SD_{13}$ DATA and $SD_{13}$ STAT FIFOs are only partially filled, it immediately passes a token onto the next filter. The microcontroller must initialize the token scheme by driving the SDTKI input pin on the first filter in the daisy chain. The microcontroller also must receive the token bit from the SDTKO output pin of the last filter in the daisy chain and send it; back to the first filter.

Figure 30A:
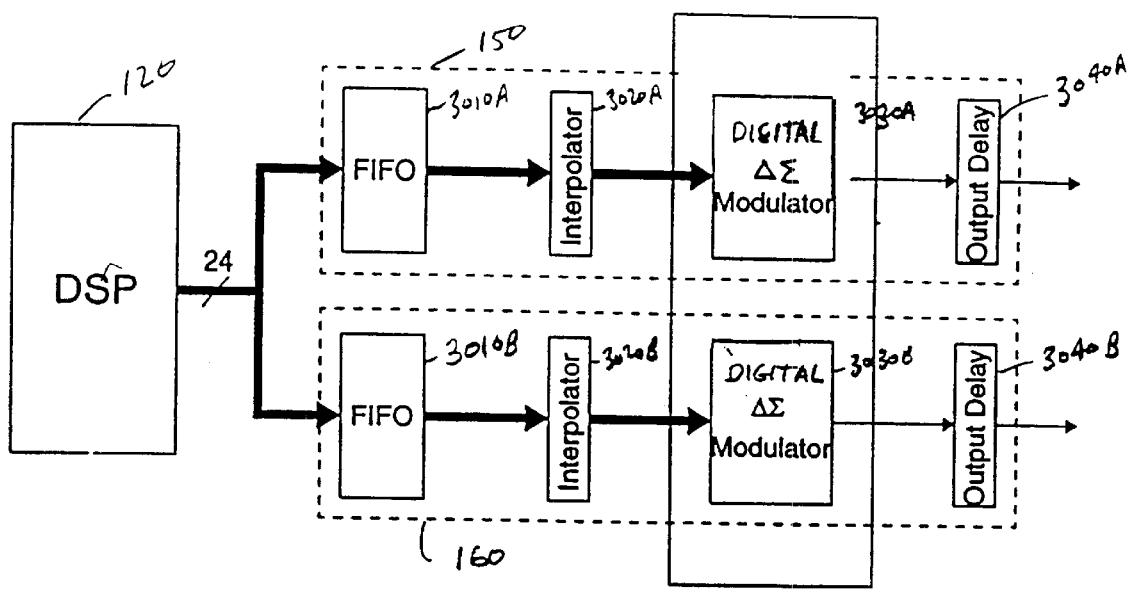
FIG. 30A is a block diagram showing the TMOD buffers and filters shown in FIG. 1 in more detail.

FIG. 30A is a block diagram showing the test signal modulator (TMOD) buffer and filters shown in FIG. 1 in more detail. Each of test modulator buffer and filters 1 and 2 (150 and 160, respectively), are substantially identical from a hardware perspective. The DSP 120 provides data to FIFO 3010A/B which is then utilized to feed the programmable interpolator 3020A/B which then drives a delta-sigma modulator 3030A/B to produce a delta-sigma version of the input signal provided by the DSP. An example would be the DSP providing 24-bit data of a 31.25 Hz sinc wave at 4 kHz to the TMOD. The TMOD would interpolate this delta-sigma ΔΣ modulator to a 1-bit, 256 kHz representation. The DSP can provide a highly accurate sinc wave or wave form of some other shape for testing on the system. The wave shape provided by the DSP would then be represented in a digital delta-sigma output format for use in testing. The output delay 3040 A/B permits the phase delay of the wave form generated by the DSP to be adjusted with considerable precision.

The TMOD is designed to perform digital delta-sigma modulation, receiving 24-bit input data and generating 1-bit output data and CLK. It is implemented using a programmable microsequencer. It produces an output bit by executing a sequence of microinstructions. Because of its programming flexibility, it can perform several variations on the basic digital delta-sigma modulator algorithm.

Figure 30B:
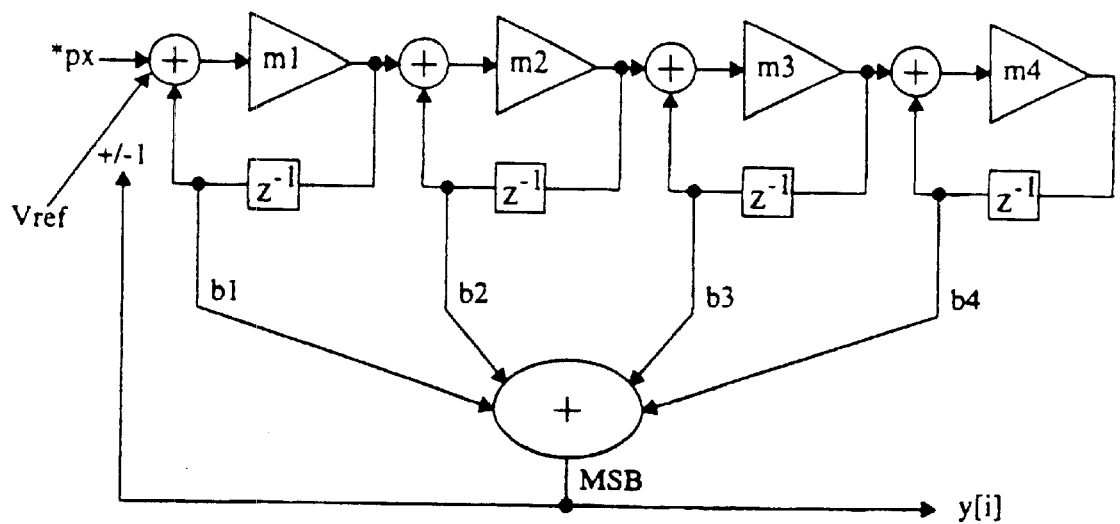
FIG. 30B is a block diagram showing a mathematical representation of a digital Σ modulator 3030A or 3030B of FIG. 30A.

FIG. 30B is a block diagram showing a mathematical representation of a digital Σ modulator 3030A or 3030B of FIG. 30A. The output of interpolators 3020A and 3020B are applied to the respective *px input of the corresponding modulator, where it is summed with a voltage Usef, the polarity of which is controlled by feedback input MSB. MSB also is applied to output y[i] as the Σ output (1Bπin this example). Higher frequency components tend to follow a different path than low frequency components.

FIGS. 30C1 through 30C10 identify symbols used in FIGS. 30D through 30H.

Figure 30D:
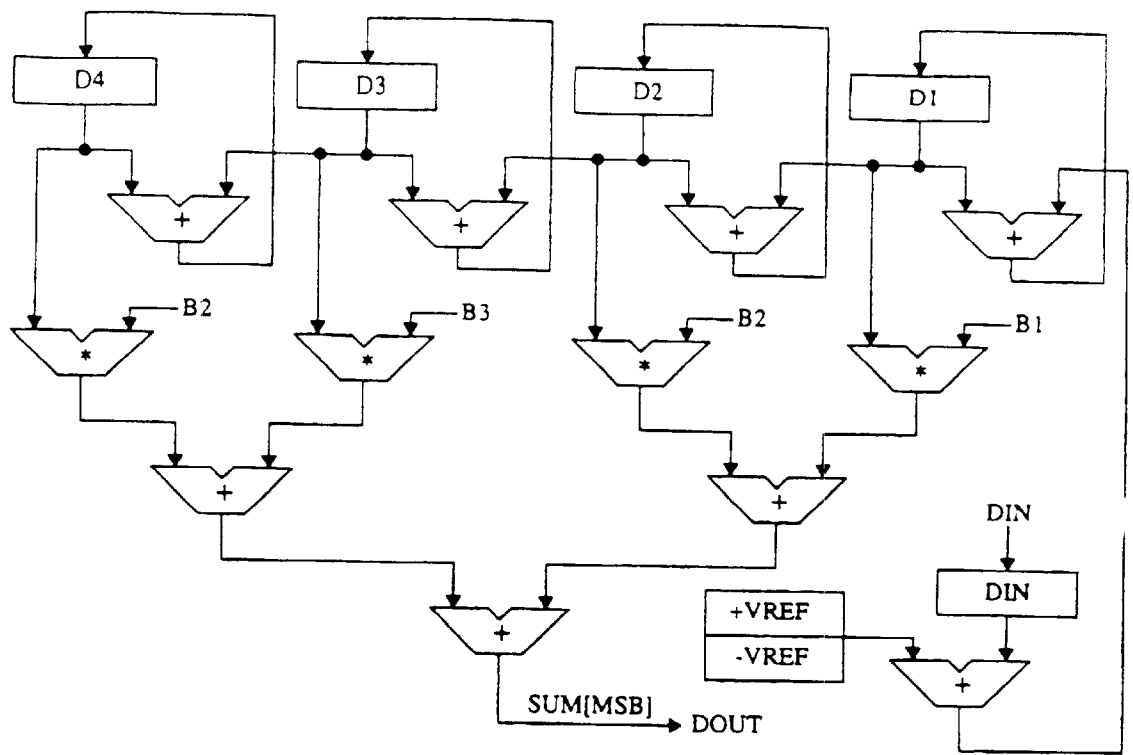
FIG. 30D shows one implementation of the digital Σ modulator of FIG. 30B using a fully parallel one clock system with multipliers.

FIG. 30D shows one implementation of the digital Σ modulator of FIG. 30B using a fully parallel one clock system with multipliers.

Figure 30E:
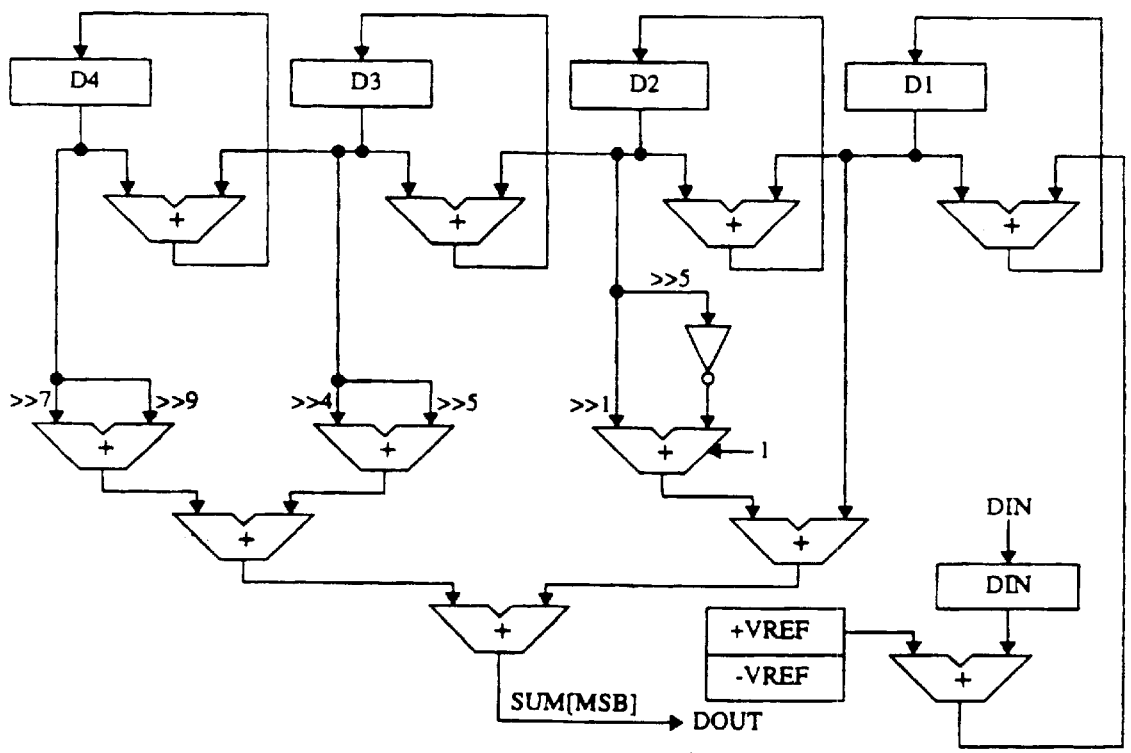
FIG. 30E shows one implementation of the digital Σ modulator of FIG. 30B using shifts and adds instead of multipliers.

FIG. 30E shows one implementation of the digital Σ modulator of FIG. 30B using shifts and adds instead of multipliers.

FIG. 30F1 shows one implementation of the digital Σ modulator of FIG. 30B using a pipeline to perform feedward summing and integration.

FIG. 30F2 is a system state table for the implementation shown in FIG. 30F1.

FIG. 30G1 shows one implementation of the digital Σ modulator of FIG. 30B using a hybrid memory system. The circuit uses a RAM and a 2 stage data pipeline to reduce the number of RAM reads/writes.

FIG. 30G2 is a system state table for the implementation shown in FIG. 30G2. Since many of the components are reused for similar operations, the control for the hybrid memory system has more states than the other system.

FIG. 30H1 shows one implementation of the digital Σ modulator of FIG. 30B that attempts to reuse hardware as much as possible.

FIG. 30H2 is a system state table for the implementation shown in FIG. 30H1.

By nature of their design, these systems can easily be adapted or modified for different configurations. The programmable nature of the integrated circuit described herein permits selective implementation of two or more of these different architectural complementation of a Σ modulator. Not only can the particular implementation, be selected, but the order N of a particular implementation can be selected by selecting different coefficient sets.

The particular architecture of an implementation, as well as the order N of the algorithm can be set and changed by control signals, for example by those originating from a sequencer.

Figure 31:
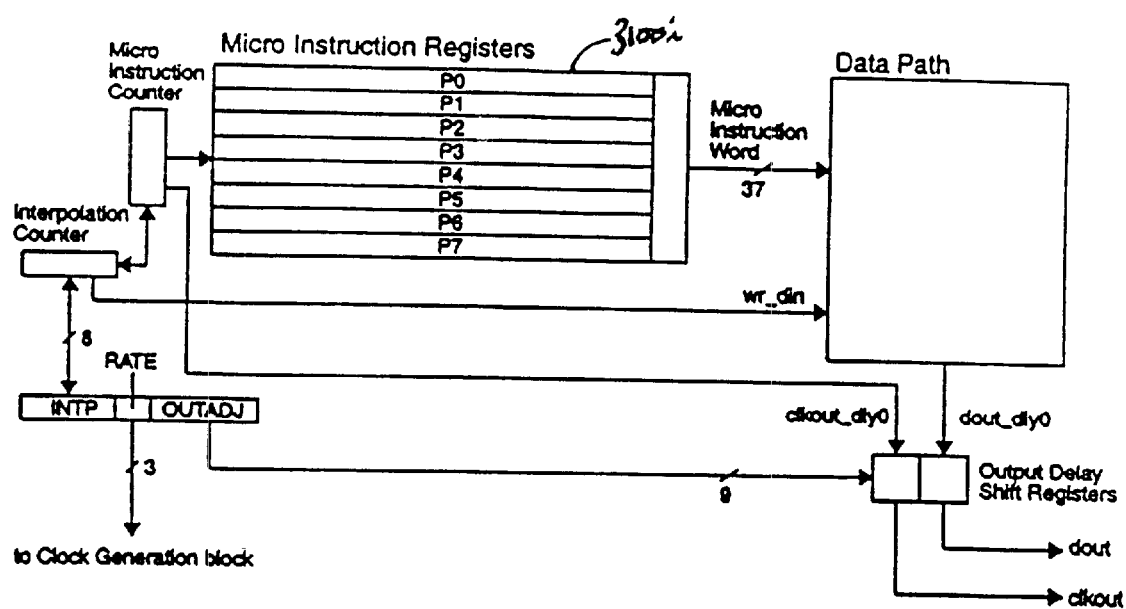

FIG. 31 shows the micro control path for operation of the test signal modulator. In operation, a user microprogram resides in microinstruction registers P0 through P7 (31001). Each of the microinstructions contains bits that control the various compound that is in the data path to perform bus enabling, addition and subtraction, arithmetic bit shifting, and register writing. When the TMOD is running, the microsequencer cycles through the microinstruction registers, enabling each one under the instruction bus in turn. By writing appropriate instructions, the user can cause the TMOD to perform almost any delta-sigma algorithm up to 5th order with one resonator. The bits of the microinstruction word are applied to the data path circuitry, shown in FIG. 32, hereinafter, to implement the delta-sigma algorithm defined by the microinstruction programming.

Figure 32:
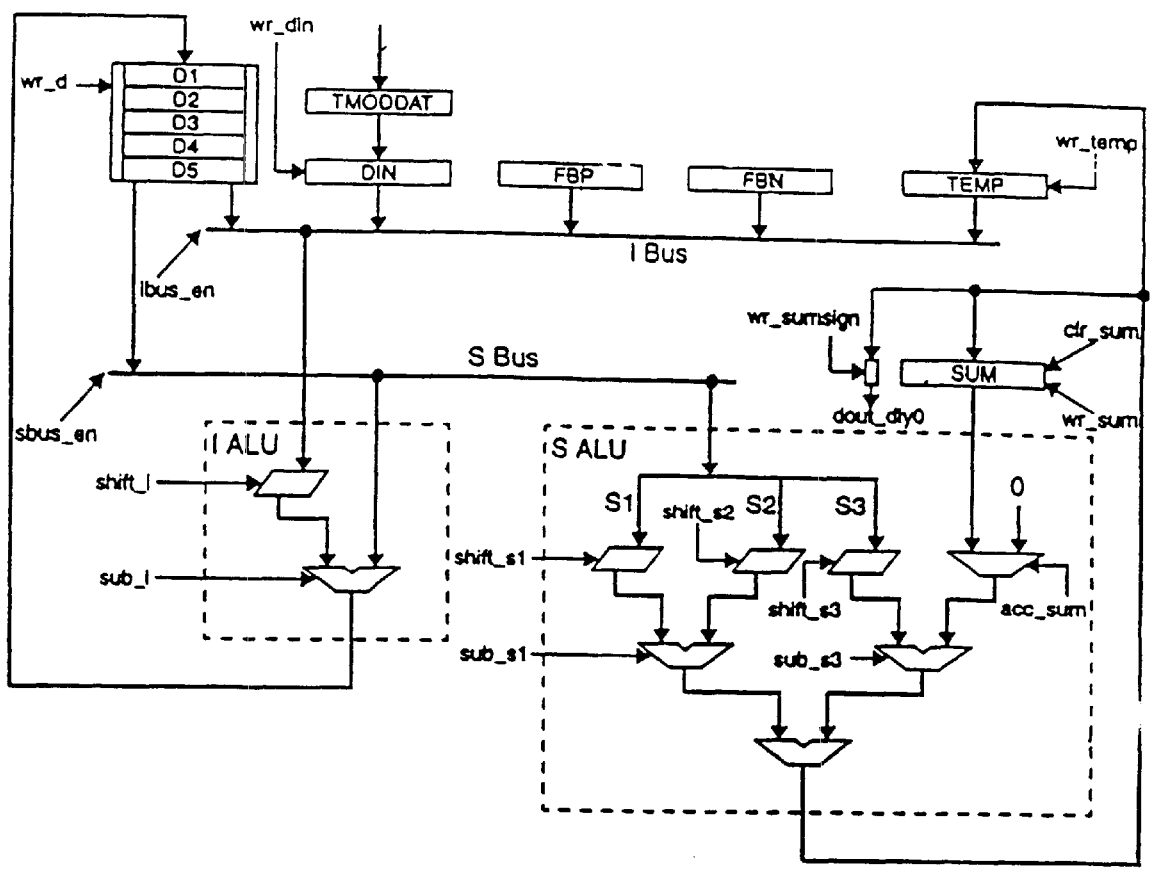
FIG. 32 shows the data path portion of the TMOD micro control path shown in FIG. 31.

FIG. 32 shows the data path portion of the TMOD micro control path shown in FIG. 31. The data path is really divided into two data paths, one to perform the integration and one to form the feed forward summation. The integration data path consists of the integration bus (I bus) in the integration ALU (the I ALU), the integration registers D1 through D5 and other registers that drive the I bus. The summation data path consists of the sum bus (S bus) and the sum ALU (S ALU), the feed forward sum register (SUM) and the sum sign register for the output bit stream. The S ALU can also be used to compute temporary quantities to be stored in temp and used in the integration process.

An example will now be given of the programming of the TMOD buffer and filter device in carrying an exemplary algorithm.

FIG. 33 shows exemplary steps needed to implement an exemplary algorithm for the test signal and modulator shown in FIG. 31. FIG. 33 shows the steps needed to implement a particular delta-sigma modulation algorithm. The functional steps that are needed to implement that algorithm correspond to various combinations of actions on the control and signal lines of the data path shown in FIG. 32.

The TMOD architecture consists of data and control registers, arithmetic logic units and buses. Most of the registers are internal and are accessible to the DSP indirectly. Internal registers include microprogram registers; feedback constant registers; configuration bits for interpolation factor, CLK rate, output and output delay, and data registers for integration in a feed forward sum. The DSP interfaces to the TMOD through two DSP I/O registers, TMODCFG and TMODDAT. The DSP uses TMODCFG and TMODDAT to configure the TMOD and uses TMODDAT to supply data during operation. During programming, the DSP writes control bits in TMODCFG which causes the contents of TMODDAT and some bits of TMODCFG to be strobed into a selected internal register. When the TMOD is running the DSP supplies the input data by writing to TMODDAT.

FIG. 34 shows the actual programming loaded into microinstruction register shown in FIG. 31 to implement the algorithm shown in FIG. 33. Given the steps shown in the algorithm shown in FIG. 33, one can determine the states of the various bits needed in order to place the hardware shown in FIG. 32 into the states necessary to implement the algorithm.

An example of the translation from the algorithm shown in FIG. 33 to the programming required to implement that algorithm in the hardware shown in FIG. 32 is shown in FIG. 34. Thus, the binary programming needed for the microinstruction registers 31001 of FIG. 31 is that shown in FIG. 34. By loading these instructions from FIG. 34 into the instruction registers of 31001, of FIG. 31, one can implement the algorithm shown in FIG. 33.

Figures 35A, 35B:
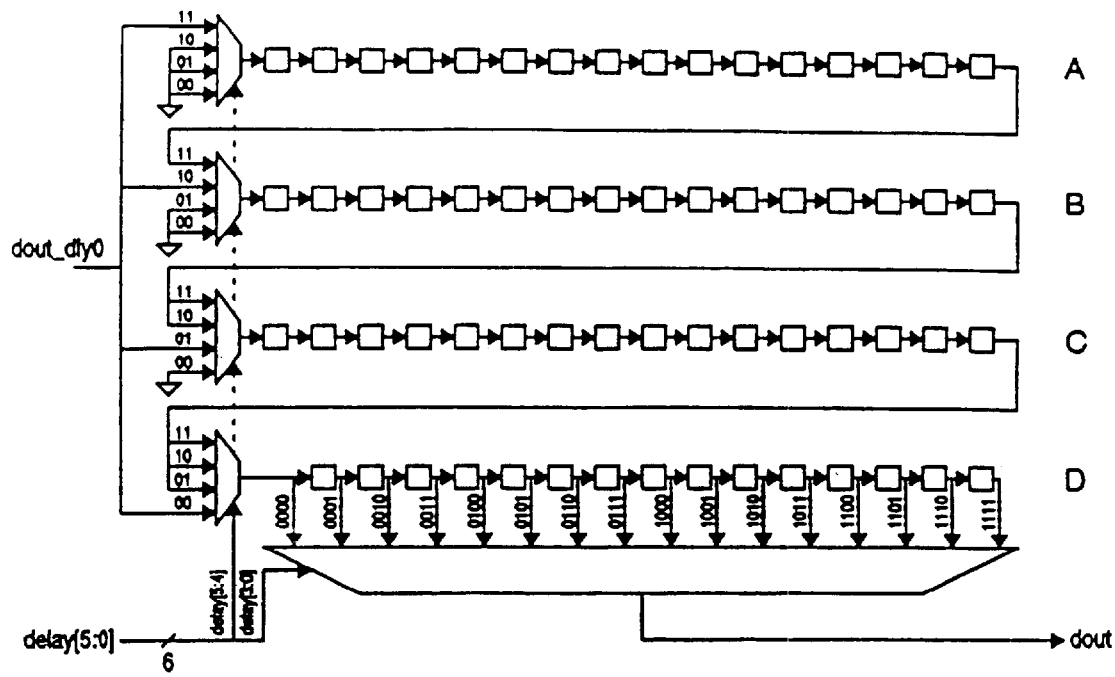
FIGS. 35A and 35B show an improved shift register with reduced area and power and a table representing the semantics of various signal lines for that shift register, respectively.

FIGS. 35A and 35B show an improved shift register with reduced area and power and a table representing the semantics of various signal lines for that shift register, respectively. The output delay shown in FIG. 30 at 3040 A/B is preferably implemented as shown in FIG. 35A. The idea is to segment the shift register into smaller shift registers. This breaks up the multiplexing that must be done at either the input or the output, and thus reduces logic area for bit selection. Power is also conserved because segments that are not used see no data transitions. It would also be possible to switch off the CLK to unused segments so as to reduce power consumption further or to eliminate power to unused segments entirely.

The architecture described results in a much simpler implementation from that which would be required to achieve a commensurate delay flexibility in the prior art.

The register illustrated achieves a delay of from 0- to 63-bits selectively. It does so in this manner by having a 15-bit register D with 16 individual taps shown which will permit delays from 0- to 15-bits.

If more than 16-bits delay is required, one or more of the 16-bit untapped shift registers A through C are selected for receiving the undelayed input. Thus, the delays are divided into four segments. Three of the segments have fixed delays of 16-bits. And one segment has a selectable delay from 0- to 15-bits. The amount of the delay is specified by a 6-bit word. The bits of that word are described in FIG. 35B. The undelayed incoming data is applied to a pin that is unique to each data segment of a selector. The particular segment to receive the undelayed data is selected by bits 4 and 5 of the delay word. If the bits are 00, then the undelayed data is applied to segment D only. If the bits are 01, the undelayed data is applied to segment C and followed by being applied to segment D with an output tab specified by bits 0 through 3 of the delay word. In this manner, one can achieve 0–63-bits delay using only 16 taps and in a way that permits power to be reduced considerably.

The maximum number of bits of delay in a segment and the maximum number of segments to be used in a shift register can be set for a particular application by adjusting the number of bits allocated to segment selection and to output stage selection. For example, if 3 bits were allocated to segment selection, instead of 2, up to 8 segments could be utilized instead of just 4. Further, if each segment contained a maximum of 32 or 8 delay increments, instead of 16, one would allocate 5 or 3 bits, respectively, to output phase selection instead of the 4 bits shown.

It has been found particularly advantageous to generate all clocks internal to the chip so that they coincide with the rising edge of the chip clock. All noise critical clocks provided external to the chip, are created on the falling edge of the chip clock.

All clocks in item 140 of FIG. 1 are programmable. That is, the division ratio used to obtain a particular clock rate from the chip clock can be programmed. Not only that, they can be programmed during the operation of the chip. The registers setting the dividers for the various clocks can be programmed over the bus using information received over a command line or interface. The arrangement for execution of a change in the programming for a particular clock occurs when a chip sync pulse occurs. This can occur, for example, at a 32 kHz rate.

FIG. 36 shows a plurality of time lines showing clock alignment associated with on-chip generation of clocks in accordance with one aspect of the invention. These time lines illustrate the principles just discussed. In FIG. 36, CLK 16 is the clock to which all other clocks are locked. A plurality of additional clocks, CLK 8, CLK 4, CLK 2, CLK 1, CLK 512 and CLK 256 are each derived from CLK 16 by a programmable division, in this case by a power of 2. These clocks operate at 8 MhZ, 4 MhZ, 1 MhZ, 512 KhZ and 256 KhZ, respectively. In addition, an S clock signal is derived and a clock sync signal CLKSYNC occurs every 8 milliseconds which resets the clock dividers and ensures that all clocks operate in lock. A plurality of ADC clocks are shown. These clocks may be, for example, clocks associated with the ADC interface. They are utilized for controlling whatever operations might be desirable within that circuit. In this case, a plurality of different clocks are shown. However, what is important is that each of these clocks utilized with off chip devices are generated on the falling edge of CLK 16. Thus, the activities which occur on the chip shown in FIG. 1 will occur at different instances from the activities occurring on external devices. This provides considerable advantage when dealing with noise and other design issues. The synchronization of clocks on a chip is particularly advantageous because it eases the interfacing of on-chip components because of the known time relationships.

Figure 37:
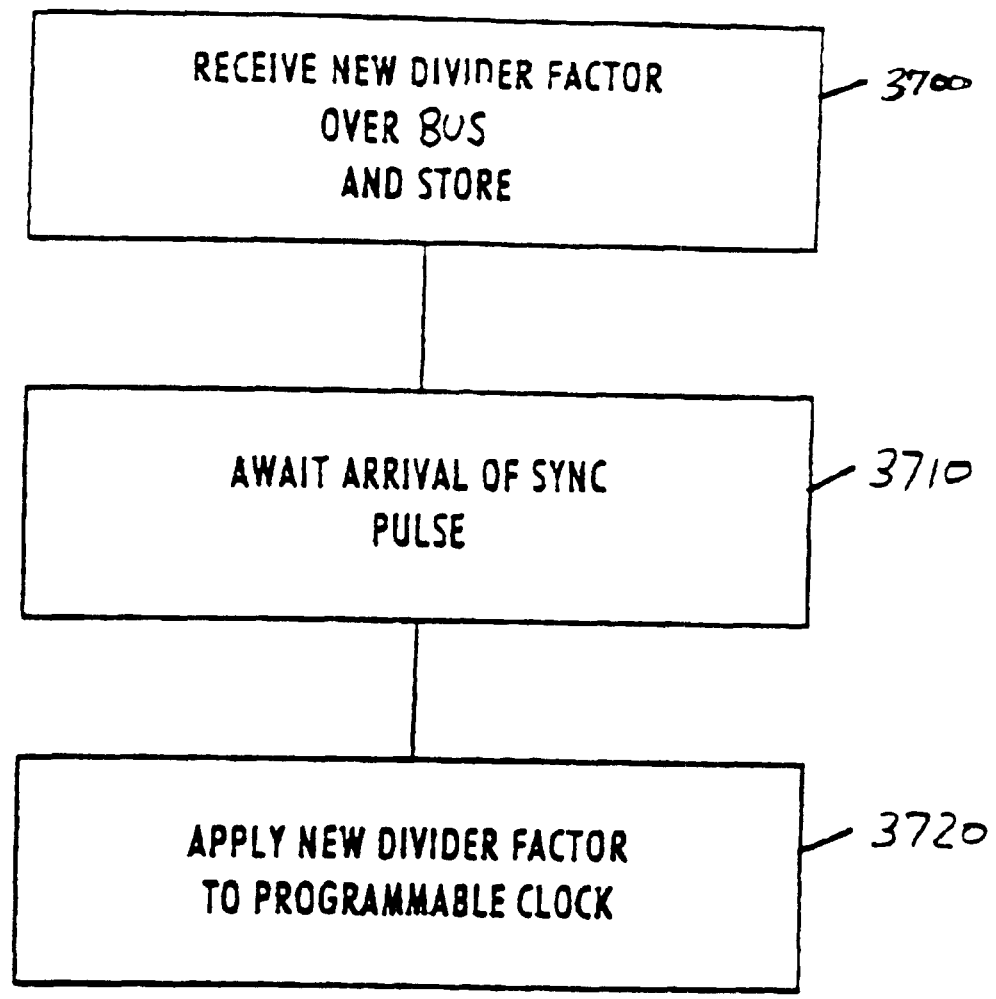
FIG. 37 is a flow chart of a process for programming clocks in accordance with the invention.

FIG. 37 is a block diagram showing how clock reprogramability is implemented in accordance with the invention. This process is described in conjunction with FIG. 36 in which an exemplary 16 megabit per second chip clock is provided to a programmable divider, the divisor of which is received over a bus, (3700) which divides the clock down to a local chip clock frequency. When a new divisor is received over the bus, the clock awaits the arrival of a sync pulse before implementing the change in clock frequency, (3710). A register is connected to the bus so that the value in the register can be programmed from the bus. However, the revised value in the register will not be applied to the programmable divider (3720) until the occurrence of a sync pulse.

By switching the programming of a clock during the sync pulse, the clock can be reprogrammed during operation without cause causing glitches in the data. Further, data interfacing among devices on the chip is easier when all clocks on the chip are synchronized.

Appendix A shows exemplary compilation tools for obtaining the content of ram1 and ram2 for the Sinc filter stage 2 and for converting bit codes generating from a perl script to DSP code.

Appendix B is matlab code utilized to generate mini-sinc impulse responses and calculates Sinc filter attenuation and rolloff.

Appendix C gives programming details for programming the Sinc2 filter.

Appendix D and Appendix E give exemplary code for the main program and the accumulate and output subroutines for the Sinc filters, respectively.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A shift register comprising:

a plurality of segments of shift register cells, serially connected;

a first selector for providing data from a shift register input selectively to an input of one of said plurality of segments;

a second selector for providing data from an input or output of a selected cell of one segment of shift register cells to a shift register output; and wherein power is reduced from any cell not traversed by data from a shift register input.

2. The shift register of claim 1, in which some bits of a multi-bit address control the selection of the first selector and in which other bits of a multi-bit address control the selection of said second selector.

3. The shift register of claim, 1 in which power is reduced or removed from any segment not traversed by data from a shift register input, based on the state of said first selector.

4. The shift register of claim 1, in which power is removed from any segment not traversed by data from a shift register input, based on the state of said first selector.

5. The shift register of claim 1, in which power is removed from any cell not traversed by data from a shift register input.

6. An integrated circuit comprising a shift register having a plurality of segments of shift register cells, serially connected;

a first selector for providing data from a shift register input selectively to an input of one of said plurality of segments wherein power is reduced from any segment not traversed by data from a shift register input, based on the state of said first selector; and a second selector for providing data from an input or output of a selected cell of one segment of shift register cells to a shift register output.

7. The integrated circuit of claim 6, in which some bits of a multi-bit address control the selection of the first selector and in which other bits of a multi-bit address control the selection of said second selector.

8. The integrated circuit of claim 6, in which power is removed from any segment not traversed by data from a shift register input, based on the state of said first selector.

9. The integrated circuit of claim 6, in which power is reduced from any cell not traversed by data from a shift register input.

10. The integrated circuit of claim 6, in which power is removed from any cell not traversed by data from a shift register input.

11. A method of designing an integrated circuit, comprising the steps of:

providing a shift register having a plurality of segments of shift register cells, serially connected and wherein power is reduced from any cell not traversed by data from a shift register input;

providing a first selector for providing data from the shift register input selectively to an input of one of said plurality of segments; and providing a second selector for providing data from an input or output of a selected cell of one segment of shift register cells to a shift register output.

12. A method of fabricating an integrated circuit, comprising the steps of:

providing a shift register having a plurality of segments of shift register cells, serially connected;

providing a first selector for providing data from a shift register input selectively to an input of one of said plurality of segments wherein power is reduced from a segment not traversed by data from a shift register input, based on the state of said first selector; and providing a second selector for providing data from an input or output of a selected cell of one segment of shift register cells to a shift register output.

* * * * *